(12) United States Patent
Handa et al.

(10) Patent No.: US 7,462,984 B2
(45) Date of Patent: Dec. 9, 2008

(54) ELECTROLUMINESCENT DEVICE WITH A LOW REFRACTIVE LAYER AND A LIGHT SCATTERING LAYER

(75) Inventors: Keishin Handa, Yokkaichi (JP); Shinji Aramaki, Yokkaichi (JP); Tetsuya Aya, Yokkaichi (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 11/220,912

(22) Filed: Sep. 8, 2005

(65) Prior Publication Data
US 2006/0049745 A1    Mar. 9, 2006

Related U.S. Application Data

(63) Continuation of application No. PCT/JP2004/003159, filed on Mar. 11, 2004.

(30) Foreign Application Priority Data

| Mar. 12, 2003 | (JP) | ............................. 2003-066845 |
| Mar. 12, 2003 | (JP) | ............................. 2003-066846 |
| Mar. 18, 2003 | (JP) | ............................. 2003-073943 |
| Apr. 17, 2003 | (JP) | ............................. 2003-113055 |

(51) Int. Cl.
*H01J 63/04* (2006.01)
(52) U.S. Cl. .................. 313/503; 313/504; 313/505; 313/506
(58) Field of Classification Search .................. None
See application file for complete search history.

(56) References Cited

U.S. PATENT DOCUMENTS 5,734,225 A * 3/1998 Biebuyck et al. ............ 313/512

| 6,592,764 | B1 | 7/2003 | Stucky et al. ............... 210/660 |
| 2001/0019242 | A1* | 9/2001 | Tada et al. .................. 313/504 |
| 2002/0153831 | A1 | 10/2002 | Sakakura et al. |
| 2004/0217702 | A1* | 11/2004 | Garner et al. ............... 313/512 |
| 2005/0007000 | A1* | 1/2005 | Chou et al. ................. 313/116 |

FOREIGN PATENT DOCUMENTS

JP    2001-202827 A    7/2001

(Continued)

OTHER PUBLICATIONS

Proceedings of Applied Physics Union Lecture (Mar. 2003), p. 1408, 27p-A-16 "Theoretical Analysis of Light Extraction Efficiency using FDTD method" with a translation thereof.

(Continued)

*Primary Examiner*—Sikha Roy
*Assistant Examiner*—Natalie K Walford
(74) *Attorney, Agent, or Firm*—Nixon & Vanderhye P.C.

(57) ABSTRACT

The electroluminescent device successively comprises a cathode, an electroluminescent layer, a transparent electrode layer, an evanescent light-scattering layer comprising a matrix composed of a low-refractive material containing light-scattering particles, and a transparent sheet/plate. Such an electroluminescent device is decreased in total reflection not only at a boundary surface between a transparent substrate and an outside air layer but also at a boundary surface of the transparent electrode layer on its light extraction side, and therefore, is considerably improved in light extraction efficiency. In addition, in the electroluminescent device provided with a barrier layer, the transparent electrode layer and the electroluminescent layer can be well protected so that deterioration of electroluminescent pigments and occurrence of dark spots can be effectively prevented, resulting in enhanced life of the device.

6 Claims, 6 Drawing Sheets

FOREIGN PATENT DOCUMENTS

| | | |
|---|---|---|
| JP | 2002-278477 | 9/2002 |
| JP | 2002-280164 A | 9/2002 |
| JP | 2002-289344 | 10/2002 |
| JP | 2002-352956 | 12/2002 |
| JP | 2003-36969 A | 2/2003 |
| WO | 2001-230069 A | 8/2001 |
| WO | 02/37568 A1 | 5/2002 |

OTHER PUBLICATIONS

Proceedings of Applied Physics Union Lecture (Mar. 2003), p. 1143, 29p-YN-12 "Fabrication and evaluation of photonic crystals composed of organic light-emitting layer and indium tin oxide (ITO)" with a translation thereof.

ULVAC Technical Journal No. 57 2002, pp. 34-36, "Development of high-efficiency light extraction window materials for flat panel displays" with summarized English translation.

Nakayama et al, "Application of Low Refractive Materials for Optical Windows . . . ", IDW 2002, pp. 1163-1166.

International Search Report of PCT/JP2004/003159, mailed Jul. 13, 2004.

Tetsuo Tsutsui, "Doubling Coupling-Out Efficiency in Organic Light-Emitting Devices using a Thin Silica Aerogel Layer", Advanced Materials, Aug. 2001, vol. 13, No. 15, pp. 1149-1152.

Soutar et al, "Sol-gel Anti-reflective Coatings", SIM (Singapore Institute of Manufacturing Technology) Technical Report (PT/01/002/ST). 2001.

* cited by examiner (a)

(b)

ELECTROLUMINESCENT DEVICE WITH A LOW REFRACTIVE LAYER AND A LIGHT SCATTERING LAYER

This application is a continuation of PCT/JP2004/003159, filed 11 Mar. 2004, claiming priority of JP 2003-066845, filed 12 Mar. 2003; JP 2003-066846, filed 12 Mar. 2003; JP 2003-073943, filed 18 Mar. 2003; and JP 2003-113055, filed 17 Apr. 2003. The entire contents of each of which are incorporated herein by reference.

TECHNICAL FIELD

The present invention relates to electroluminescent (EL) devices, and more particularly to electroluminescent devices capable of extracting light from an electroluminescent layer thereof at a high efficiency.

BACKGROUND ART

Conventional electroluminescent devices used in EL displays or EL illumination apparatuses have a layer structure including a cathode, an electroluminescent layer, a transparent electrode (anode) and a transparent substrate. These electroluminescent devices are operated by utilizing such a light emission principle that holes injected from the anode and electrons injected from the cathode are recombined with each other in the electroluminescent layer, so that an emission center therein is excited by the recombination energy to emit a light therefrom.

In the EL displays, although it is required to efficiently extract the emitted light on a side of the transparent substrate, the light extraction efficiency (which means a percentage of light extracted outside from the device to that generated in the electroluminescent layer) on the side of the transparent substrate is as low as about 20% owing to reflection of the emitted light at a boundary surface between the transparent substrate and an outside air layer.

In order to decrease reflection of light at the boundary between the transparent substrate and the air layer, there has been proposed a method of disposing a low-refractive layer between the transparent substrate and the transparent electrode layer to refract light having a large incident angle to substrate from transparent electrode, thereby enhancing the light extraction efficiency (Japanese Patent Application Laid-Open (KOKAI) No. 2002-278477).

In the above conventional method, the reflection of light at the boundary surface between the transparent substrate and the air layer is prevented by providing the low-refractive layer. However, this method has failed to take account of reflection of light at a boundary surface between the transparent electrode layer and the low-refractive layer. Rather, in the method, there tends to be caused such a problem that the provision of the low-refractive layer promotes total reflection of light at the boundary between the transparent electrode layer and the low-refractive layer. The total reflection light thus produced is attenuated upon light guide due to reflection caused inside of the transparent electrode layer and the light-emitting layer as well as at the cathode, and, therefore, cannot be extracted outside from the device.

The present invention has been conducted to overcome the above conventional problems. An object of the present invention is to provide an electroluminescent device in which the total reflection not only at a boundary surface between a transparent substrate and an outside air layer but also at a boundary surface of a transparent electrode layer on its light extraction side is decreased, and which is fully improved light extraction efficiency.

DISCLOSURE OF THE INVENTION

The above object of the present invention can be accomplished by the following embodiments (1) to (8).

(1) In a first aspect of the first invention, there is provided an electroluminescent device successively comprising a cathode, an electroluminescent layer, a transparent electrode layer and a transparent sheet/plate, wherein an evanescent light-scattering layer (A) comprising a matrix composed of a low-refractive material containing light-scattering particles is provided between the transparent electrode layer and the transparent sheet/plate.

(2) In a second aspect of the first invention, there is provided an electroluminescent device successively comprising a cathode, an electroluminescent layer, a transparent electrode layer, a low refractive layer and a transparent sheet/plate, wherein an evanescent light-scattering layer (A) comprising a matrix composed of a low-refractive material containing light-scattering particles is provided between the transparent electrode layer and the low-refractive layer, and the matrix constituting the evanescent light-scattering layer (A) has a refractive index which is substantially identical to that of the low-refractive layer and is lower than that of the transparent electrode layer.

(3) In a first aspect of the second invention, there is provided an electroluminescent device successively comprising a cathode, an electroluminescent layer, a transparent electrode layer and a transparent sheet/plate, wherein an evanescent light-scattering layer (A) comprising a matrix composed of a low-refractive material containing light-scattering particles is provided between the transparent electrode layer and the transparent sheet/plate, and a barrier layer is provided between the evanescent light-scattering layer (A) and the transparent electrode layer to prevent a material within the evanescent light-scattering layer (A) from being transferred into the transparent electrode layer.

The barrier layer having a refractive index substantially identical to or higher than that of the transparent electrode layer as well as a light absorption in a visible range lower than that of the transparent electrode layer, causes a part of guided light in the transparent electrode layer to be transferred thereinto, and prevents attenuation of light upon light guide. Therefore, it is also expected to attain such an effect of further improving the light extraction efficiency.

(4) In a second aspect of the second invention, there is provided an electroluminescent device successively comprising a cathode, an electroluminescent layer, a transparent electrode layer, a low-refractive layer and a transparent sheet/plate, wherein an evanescent light-scattering layer (A) comprising a matrix composed of a low-refractive material containing light-scattering particles is provided between the transparent electrode layer and the low-refractive layer; a barrier layer is provided between the evanescent light-scattering layer (A) and the transparent electrode layer to prevent a material within the low-refractive layer from being transferred into the transparent electrode layer; and the matrix constituting the evanescent light-scattering layer (A) has a refractive index which is substantially identical to that of the low-refractive layer and is lower than that of the transparent electrode layer.

(5) In a first aspect of the third invention, there is provided an electroluminescent device successively comprising a cathode, an electroluminescent layer, a transparent electrode layer, a low-refractive layer and a transparent sheet/plate, wherein the transparent electrode layer contains light-scattering particles.

(6) In a second aspect of the third invention, there is provided an electroluminescent device successively comprising a cathode, an electroluminescent layer, a transparent electrode layer, a low-refractive layer and a transparent sheet/plate, wherein an evanescent light-scattering layer (B) which contains light-scattering particles, is provided between the transparent electrode layer and the transparent sheet/plate, and a matrix constituting the evanescent light-scattering layer (B) has a refractive index which is substantially identical to that of the transparent electrode layer.

(7) In a first aspect of the fourth invention, there is provided an electroluminescent device successively comprising a cathode, an electroluminescent layer, a transparent electrode layer, a low-refractive layer and a transparent sheet/plate, wherein a boundary surface between the transparent electrode layer and the transparent sheet/plate is provided with light-scattering roughness.

(8) In a second aspect of the fourth invention, there is provided an electroluminescent device successively comprising a cathode, an electroluminescent layer, a transparent electrode layer, a low-refractive layer and a transparent sheet/plate, wherein a high-refractive layer having a refractive index substantially identical to that of the transparent electrode layer is provided between the transparent electrode layer and the transparent sheet/plate, and a boundary surface between the high-refractive layer and the transparent sheet/plate is provided with light-scattering roughness.

PREFERRED EMBODIMENT FOR CARRYING OUT THE INVENTION

The present invention is described in detail below.

Figure 13:
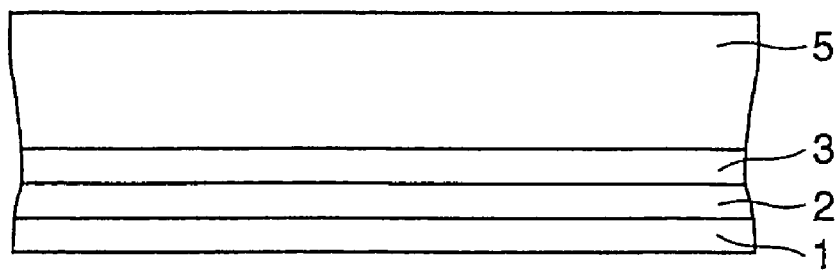
FIG. 13(*a*) is an explanatory view showing a layer structure of a conventional electroluminescent device, and FIG. 13(*b*) is an explanatory view of total reflection of light having a large incident angle to substrate from transparent electrode.
Figure 13:
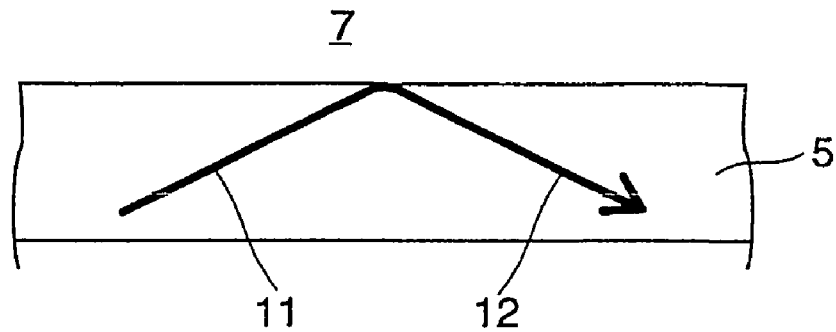
Figure 14:
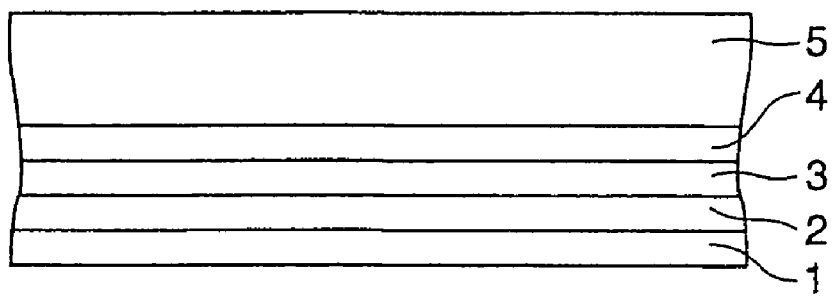
FIG. 14 is an explanatory view showing another layer structure of the conventional electroluminescent device.

In advance of explaining the present invention, the conventional electroluminescent device is described by referring to FIG. 13(*a*), FIG. 13(*b*) and FIG. 14. FIG. 13(*a*) is an explanatory view showing a layer structure of the conventional electroluminescent device, and FIG. 13(*b*) is an explanatory view of total reflection of light having a large incident angle to substrate from transparent electrode. FIG. 14 is an explanatory view showing another layer structure of the conventional electroluminescent device.

As shown in FIG. 13(*a*), the conventional electroluminescent device has a layer structure including at least a substrate 5, a transparent electrode layer (anode) 3, an electroluminescent layer 2 and a cathode 1. In electroluminescent devices, it is required to efficiently extract light emitted in the electroluminescent layer 2 on the side of the transparent substrate 5. However, as shown in FIG. 13(*b*), the light 11 emitted in the electroluminescent layer 2 which has a large incident angle to substrate from transparent electrode undergoes total reflection at a boundary surface between the substrate 5 and air 7, and is mainly converted into a guided light 12 which proceeds inside of the substrate 5 while undergoing total reflection in the plane direction. Due to generation of the guided light 12, the light extraction efficiency from the substrate 5 tends to be decreased to about 20%.

To solve the above problem, the electroluminescent device as shown in FIG. 14 is provided on the surface of the substrate 5 facing the side of the electroluminescent layer 2, with a low-refractive layer 4. Therefore, the light 11 having a large incident angle to substrate from transparent electrode is refracted at the low-refractive layer 4, so that generation of guided light is prevented, resulting in enhanced light extraction efficiency. In such an electroluminescent device, although the total reflection at the boundary surface between the substrate 5 and the air layer 7 is decreased, light reflection at a boundary surface between the transparent electrode layer 3 and the low-refractive layer 4 is increased.

Further, the total reflection light is attenuated upon being guided by reflection inside of the transparent electrode layer or light emitting layer as well as reflection on the cathode, and cannot be extracted outside from the device (reference literatures: Chu Chinan, et al., the preliminary report of "Spring Meeting of Institute of Allied Physics", 2003, 27P-A-16, and Fujita, et al., the preliminary report of "Spring Meeting of Institute of Allied Physics", 2003, 29-YN-13).

To solve the above conventional problems, in the electroluminescent device of the present invention, light reflection at a boundary surface of the transparent electrode layer 3 opposite to the electroluminescent layer 2 (namely, on a side of the transparent electrode layer 3 opposite to its surface contacting with the electroluminescent layer 2) can be decreased.

First, basic layers constituting the electroluminescent device of the present invention include a substrate, a cathode, an electroluminescent layer, a transparent electrode layer, a low-refractive layer (which may not be provided), a substrate or protective cover as a transparent sheet/plate, etc.

First, the cathode, electroluminescent layer, transparent electrode layer, low-refractive layer, substrate and protective cover, etc., which are used in the present invention, are explained.

(A) Cathode:

The cathode is disposed in an opposed relation to the transparent electrode layer such that the electroluminescent layer is sandwiched between the cathode and the transparent electrode layer. The cathode is composed of aluminum, tin, magnesium, indium, calcium, gold, silver, copper, nickel, chromium, palladium, platinum, magnesium-silver alloys, magnesium-indium alloys, aluminum-lithium alloys, etc. In particular, among these cathodes, preferred is a cathode composed of aluminum. The thickness of the cathode is usually 10 to 1000 nm, preferably 30 to 500 nm, more preferably 50 to 300 nm. The cathode may be produced by a vacuum film-forming process such as vapor deposition and sputtering.

(B) Electroluminescent Layer:

The electroluminescent layer is composed of a material exhibiting a light emission phenomenon upon applying an electric field thereto. As the material of the electroluminescent layer, there may be used conventionally used inorganic EL materials such as activated zinc oxide represented by the formula: ZnS:X (wherein X is an activating element such as Mn, Tb, Cu and Sm), CaS:Eu, SrS:Ce, $SrGa_2S_4$:Ce, $CaGa_2S_4$:Ce, CaS:Pb and $BaAl_2S_4$:Eu; and conventionally used organic EL materials such as low-molecular pigment-based organic EL materials such as aluminum complexes of 8-hydroxyquinoline, aromatic amines and anthracene single crystals; and conjugated polymer-based organic EL materials such as poly(p-phenylenevinylene), poly[2-methoxy-5-(2-ethylhexyloxy)-1,4-phenylenevinylene], poly(3-alkylthiophene) and polyvinyl carbazole. The thickness of the electroluminescent layer is usually 10 to 1000 nm, preferably 30 to 500 nm, more preferably 50 to 200 nm. The electroluminescent layer may be produced by a vacuum film-forming process such as vapor deposition and sputtering, or a coating process using chloroform, etc., as a solvent.

(C) Transparent electrode layer 3:

The transparent electrode layer has a function as an anode for the electroluminescent device. As the material of the transparent electrode layer, there may be used thin films composed of composite oxides such as tin-added indium oxide (generally called "ITO"), aluminum-added zinc oxide (generally called "AZO") and indium-added zinc oxide (generally called "IZO"). Among these materials, preferred is ITO.

The transparent electrode layer may be produced by a vacuum film-forming process such as vapor deposition and sputtering. The thus formed transparent electrode preferably has a light transmittance in visible light range as large as possible, for example, usually 50 to 99%. The lower limit of the light transmittance of the transparent electrode layer is preferably 60%, more preferably 70%. The electric resistance of the transparent electrode is preferably as small as possible calculated as a sheet resistivity value thereof, preferably 1 to 100 $\Omega/\square$ (=1 $cm^2$). The upper limit of the sheet resistivity value of the transparent electrode is usually 70 $\Omega/\square$, more preferably 50 $\Omega/\square$. Also, the thickness of the transparent electrode is not particularly limited as long as the light transmittance and sheet resistivity value thereof satisfy the above specified ranges, and usually 0.01 to 10 μm. From the standpoint of a good conductivity, the lower limit of the thickness of the transparent electrode is preferably 0.03 μm, more preferably 0.05 μm. On the other hand, from the standpoint of a good light transmittance, the upper limit of the thickness of the transparent electrode is preferably 1 μm, more preferably 0.5 μm.

The transparent electrode layer is formed into patterns required as an electrode of the electroluminescent device by a photo-lithographic method, etc. In addition, the transparent electrode layer may also be produced by a coating method.

(D) Low-refractive Layer:

It is important that the refractive index of the low-refractive layer is lower than that of the transparent electrode layer, and is preferably lower than that of the transparent sheet/plate. The refractive index of the low-refractive layer is usually 1.1 to 1.9, preferably 1.1 to 1.6, more preferably 1.2 to 1.5, still more preferably 1.2 to 1.35. When the refractive index of the low-refractive layer is too low, the resultant film layer tends to be insufficient in mechanical strength. Further, in the case where the low-refractive layer is composed of a silicate material, the content of silanol therein tends to be increased, resulting in higher hydrophilicity thereof which is disadvantageous to the EL device. When the refractive index of the low-refractive layer is too high, an amount of total reflection light on a side of the low-refractive layer facing the transparent sheet/plate or on a side of the transparent sheet/plate facing air tends to be increased, resulting in poor light extraction efficiency.

The refractive index of the low-refractive layer may be measured using an "ellipsometer" (manufactured by "Sopra") on the basis of Standard D542. However, in the case where a matrix portion of the low-refractive layer is composed of a meso(nano)-porous material or a particle-dispersing material, it may be difficult to accurately measure the refractive index using the "ellipsometer" because of an inclined structure thereof, etc. In such a case where the measurement using the "ellipsometer" is difficult, the refractive index may be measured by "PRISM COUPLER MODEL 2010" manufactured by Metricon Inc., U.S.A. (in which the refractive index is measured according to a mode of guided light generated in the film) using a laser having a wavelength of 405 nm or 633 nm.

Examples of the material of the low-refractive layer may include silica, transparent fluoride resins such as cyclic Teflon, magnesium fluoride, etc. In particular, among these materials, preferred is porous silica. The silica may contain, if required, organic components for the purposes of hydrophobicity-imparting treatment, flexibilizing treatment or prevention of cracks.

The porous silica film may be produced, for example, through the following steps: (1) a step of preparing a raw solution for forming the porous silica film; (2) a step of applying the thus prepared raw solution onto a substrate to form a primary coating film; (3) a step of polymerizing the thus formed primary coating film to form an intermediate film; (4) a step of contacting the intermediate film with a water-soluble organic solvent to form a porous silica film; and (5) a step of drying the porous silica film.

However, in view of the aimed object of forming the low-refractive film, the production method is not particularly limited to the method including the above steps as long as the requirements therefor are satisfied. For example, porous films (meso-porous films) obtained by the production processes described in the following literatures may also be used as long as the requirement for the low-refractive film are satisfied: Japanese Patent Application Laid-Open (KOKAI) No. 2002-278477, U.S. Pat. No. 6,592,764, "Technical Report of Ulvac Inc.", No. 57, September, 2002, pp. 34-36, and IDW2002 Preliminary Report, pp. 1163-1166.

Next, the above respective steps are explained.

(1) Step of Preparing a Raw Solution for Forming the Porous Silica Film:

The raw solution for forming the porous silica film contains alkoxysilanes as main components, and is a water-containing organic solution containing a raw compound capable of being polymerized by hydrolysis reaction and dehydration condensation reaction.

The water-containing organic solution as the raw solution may contain alkoxysilanes, a hydrophilic organic solvents and water as well as a catalyst, if required.

Examples of the alkoxysilanes may include tetraalkoxysilanes such as tetramethoxysilane, tetraethoxysilane, tetra(n-propoxy)silane, tetraisopropoxysilane and tetra(n-butoxy)silane; trialkoxysilanes such as trimethoxysilane, triethoxysilane, methyl trimethoxysilane, methyl triethoxysilane, phenyl trimethoxysilane and phenyl triethoxysilane; dialkoxysilanes such as dimethyl dimethoxysilane, dimethyl diethoxysilane, diphenyl dimethoxysilane and diphenyl diethoxysilane; compounds obtained by bonding two or more trialkoxysilyl groups through an organic residue, such as bis(trimethoxysilyl)methane, bis(triethoxysilyl)methane, 1,2-bis(trimethoxysilyl)ethane, 1,2-bis(triethoxysilyl)ethane, 1,4-bis(trimethoxysilyl)benzene, 1,4-bis(triethoxysilyl)benzene and 1,3,5-tris(trimethoxysilyl)benzene; and compounds in which an alkyl substituent group bonded to a silicon atom has a reactive functional group, such as 3-aminopropyl trimethoxysilane, 3-aminopropyl triethoxysilane, 3-glycidyloxypropyl trimethoxysilane, 3-glycidyloxypropyl triethoxysilane, 3-mercaptopropyl trimethoxysilane, 3-acryloyloxypropyl trimethoxysilane and 3-carboxypropyl trimethoxysilane; as well as partially hydrolyzed products or oligomers thereof.

Among these alkoxysilanes, preferred are tetramethoxysilane, tetraethoxysilane, trimethoxysilane, triethoxysilane, and oligomers of tetramethoxysilane or tetraethoxysilane. In particular, the oligomers of tetramethoxysilane are still more preferred in the consideration of well-controlled reactivity and gelation thereof.

Further, the above alkoxysilanes may be blended with monoalkoxysilanes having two or three hydrogen atoms, alkyl groups or aryl groups bonded to the silicon atom. In the case where the monoalkoxysilanes are blended with the alkoxysilanes, the resultant porous silica film is well hydrophobilized and enhanced in water resistance. Examples of the monoalkoxysilanes may include triethylmethoxysilane, triethylethoxysilane, tripropylmethoxysilane, triphenylmethoxysilane, triphenylethoxysilane, diphenylmethyl methoxysilane and diphenylmethyl ethoxysilane. The amount of the monoalkoxysilanes blended is not more than 70 mol % based on the whole alkoxysilanes. When the amount of the monoalkoxysilanes blended is more than 70 mol %, the obtained raw solution may fail to be gelled.

In addition, when the above alkoxysilanes is used in combination with alkoxysilanes having a fluorinated alkyl group or a fluorinated acryl group such as (3,3,3-trifluoropropyl)trimethoxysilane, (3,3,3-trifluoropropyl)triethoxysilane, pentafluorophenyl trimethoxysilane and pentafluorophenyl triethoxysilane, the obtained porous silica film is excellent in water resistance, moisture resistance, anti-staining property, etc.

The oligomers contained in the raw solution may be in the form of a crosslinked, cage-type molecule (such as silsesquioxane).

The degree of condensation of a condensate contained in the water-containing organic solution is adjusted such that the solution exhibits such a transparency that the light transmittance, for example, as measured at a wavelength of 400 nm, a temperature of 23° C. and an optical path length of 10 mm is usually 90 to 100%. The lower limit of the light transmittance of the solution is preferably not less than 92%, more preferably not less than 95%.

Meanwhile, upon applying the raw solution, it is required that the components contained in the solution are polymerized to some extent (i.e., in such a condition that the condensation reaction thereof proceeds to some extent). The degree of the polymerization is preferably adjusted to such an extent that no insoluble solids are recognized by visual observation. This is because if any insoluble solids which can be visually observed are present in the raw solution before application thereof, large roughness tend to be formed on the surface of the obtained coating film, resulting in deteriorated quality of the film.

As the organic solvent, there are preferably used those solvents capable of allowing the alkoxysilanes, water and the below-mentioned hydrophilic organic compound having a boiling point of not less than 80° C. as components of the raw solution, to be miscible with each other. Examples of the organic solvent usable in the present invention may include alcohols such as monohydric alcohols having 1 to 4 carbon atoms, dihydric alcohols having 1 to 4 carbon atoms and polyhydric alcohols such as glycerol and pentaerythritol; ethers or esters of the above alcohols such as diethyleneglycol, ethyleneglycol monomethyl ether, ethyleneglycol dimethyl ether, 2-ethoxyethanol, propyleneglycol monomethyl ether and propyleneglycol methyl ether acetate; ketones such as acetone and methyl ethyl ketone; amides such as formamide, N-methyl formamide, N-ethyl formamide, N,N-dimethyl formamide, N,N-diethyl formamide, N-methyl acetamide, N-ethyl acetamide, N,N-dimethyl acetamide, N,N-diethyl acetamide, N-methyl pyrrolidone, N-formyl morpholine, N-acetyl morpholine, N-formyl piperidine, N-acetyl piperidine, N-formyl pyrrolidine, N-acetyl pyrrolidine, N,N'-diformyl piperadine and N,N'-diacetyl piperadine; lactones such as γ-butyrolactone; ureas such as tetramethyl urea and N,N'-dimethyl imidazoline; and dimethyl sulfoxides. These water-soluble organic solvents may be used singly or in the form of a mixture of any two or more thereof. Among these organic solvents, from the standpoint of a good film-forming property on the substrate (especially volatility), preferred are acetone, methyl ethyl ketone and monohydric alcohols having 1 to 4 carbon atoms; more preferred are methanol, ethanol, n-propanol, isopropyl alcohol and acetone; and still more preferred are methanol and ethanol.

As the hydrophilic organic compound having a boiling point of not less than 80° C., there may be used such organic compounds containing a hydrophilic functional group such as a hydroxyl group, a carbonyl group, an ether bond, an ester bond, a carbonate bond, a carboxyl group, an amide bond, an urethane bond and a urea bond in a molecular structure thereof. The hydrophilic organic compound may contain plural kinds of hydrophilic functional groups selected from the above functional groups in a molecular structure thereof. The "boiling point" used herein means a boiling point as measured under a pressure of 760 mmHg. In the case where the hydrophilic organic compound used has a boiling point less than 80° C., the resultant porous silica film tends to be extremely decreased in porosity thereof. Examples of the hydrophilic organic compound having a boiling point of not less than 80° C. may include alcohols having 3 to 8 carbon atoms, polyhydric alcohols having 2 to 6 carbon atoms, and phenols. Among these hydrophilic organic compounds, preferred are alcohols having 3 to 8 carbon atoms, diols having 2 to 8 carbon atoms, triols having 3 to 8 carbon atoms and tetraols having 4 to 8 carbon atoms. Specific examples of the more preferred hydrophilic organic compounds may include alcohols having 4 to 7 carbon atoms such as n-butanol, isobutyl alcohol, t-butyl alcohol, n-pentanol, cyclopentanol, n-hexanol, cyclohexanol and benzyl alcohol; diols having 2 to 4 carbon atoms such as ethyleneglycol, propyleneglycol and 1,4-butanediol; triols having 3 to 6 carbon atoms such as glycerol and trishydroxymethyl ethane; and tetraols having 4 to 5 carbon atoms such as erythritol and pentaerythritol. The hydrophilic organic compounds having a too large number of carbon atoms tend to be deteriorated in hydrophilicity.

The catalyst may be optionally blended in the porous silica film, if required. As the catalyst, there may be used those substances capable of promoting the hydrolysis reaction and dehydration condensation reaction of the above alkoxysilanes. Specific examples of the catalyst may include acids such as hydrochloric acid, nitric acid, sulfuric acid, formic acid, acetic acid, oxalic acid and maleic acid; amines such as ammonia, butylamine, dibutylamine and triethylamine; bases such as pyridine; Lewis acids such as aluminum acetylacetone complexes; and metal chelate compounds.

Examples of metals contained in the metal chelate compounds as the catalyst may include titanium, aluminum, zirconium, tin and antimony. Specific examples of the metal chelate compounds are as follows.

Specific examples of the aluminum complexes may include aluminum chelate compounds such as di-ethoxy-mono(acetylacetonate)aluminum, di-n-propoxy-mono(acetylacetonate)aluminum, di-isopropoxy-mono(acetylacetonate)aluminum, di-n-butoxy-mono(acetylacetonate)aluminum, di-sec-butoxy-mono(acetylacetonate)aluminum, di-tert-butoxy-mono(acetylacetonate)aluminum, monoethoxy-bis(acetylacetonate)aluminum, mono-n-propoxy-bis(acetylacetonate)aluminum, monoisopropoxy-bis(acetylacetonate)aluminum, mono-n-butoxy-bis(acetylacetonate)aluminum, mono-sec-butoxy-bis(acetylacetonate)aluminum, mono-tert-butoxy-bis(acetylacetonate)aluminum, tris(acetylacetonate)aluminum, diethoxy-mono(ethylacetonate)aluminum, di-n-propoxy-mono(ethylacetonate)aluminum, diisopropoxy-mono(ethylacetonate)aluminum, di-n-butoxy-mono(ethylacetonate)aluminum, di-sec-butoxy-mono(ethylacetonate)aluminum, di-tert-butoxy-mono(ethylacetonate)aluminum, monoethoxy-bis(ethylacetonate)aluminum, mono-n-propoxy-bis(ethylacetonate)aluminum, monoisopropoxy-bis(ethylacetonate)aluminum, mono-n-butoxy-bis(ethylacetonate)aluminum, mono-sec-butoxy-bis(ethylacetonate)aluminum, mono-tert-butoxy-bis(ethylacetonate)aluminum and tris(ethylacetonate)aluminum.

Specific examples of the titanium complexes may include triethoxy-mono(acetylacetonate)titanium, tri-n-propoxy-mono(acetylacetonate)titanium, triisopropoxy-mono(acetylacetonate)titanium, tri-n-butoxy-mono(acetylacetonate)titanium, tri-sec-butoxy-mono(acetylacetonate)titanium, tri-tert-butoxy-mono(acetylacetonate)titanium, diethoxy-bis(acetylacetonate)titanium, di-n-propoxy-bis(acetylacetonate)titanium, diisopropoxy-bis(acetylacetonate)titanium, di-n-butoxy-bis(acetylacetonate)titanium, di-sec-butoxy-bis(acetylacetonate)titanium, di-tert-butoxy-bis(acetylacetonate)titanium, monoethoxy-tris(acetylacetonate)titanium, mono-n-propoxy-tris(ethylacetonate)titanium, monoisopropoxy-tris(ethylacetonate)titanium, mono-n-butoxy-tris(ethylacetonate)titanium, mono-sec-butoxy-tris(ethylacetonate)titanium, mono-tert-butoxy-tris(ethylacetonate)titanium, tetrakis(acetylacetonate)titanium, triethoxy-mono(ethylacetonate)titanium, tri-n-propoxy-mono(ethylacetonate)titanium, triisopropoxy-mono(ethylacetonate)titanium, tri-n-butoxy-mono(ethylacetonate)titanium, tri-sec-butoxy-mono(ethylacetonate)titanium, tri-tert-butoxy-mono(ethylacetonate)titanium, diethoxy-bis(ethylacetonate)titanium, di-n-propoxy-bis(ethylacetonate)titanium, diisopropoxy-bis(ethylacetonate)titanium, di-n-butoxy-bis(ethylacetonate)titanium, di-sec-butoxy-bis(ethylacetonate)titanium, di-tert-butoxy-bis(ethylacetonate)titanium, monoethoxy-tris(ethylacetonate)titanium, mono-n-propoxy-tris(ethylacetonate)titanium, monoisopropoxy-tris(ethylacetonate)titanium, di-n-butoxy-bis(ethylacetonate)titanium, mono-sec-butoxy-tris(ethylacetonate)titanium, mono-tert-butoxy-tris(ethylacetonate)titanium, tetrakis(ethylacetonate)titanium, mono(acetylacetonate)tris(ethylacetonate)titanium, bis(acetylacetonate)bis(ethylacetonate)titanium and tris(acetylacetonate)mono(ethylacetonate)titanium.

Further, in addition to the above catalyst, there may also be used a basic catalyst such as a weak-alkaline compound, for example, ammonia. In this case, the concentration of silica, the kind of organic solvent, etc., are suitably controlled. Also, upon preparation of the water-containing organic solution, the concentration of the catalyst in the solution is preferably prevented from being rapidly increased. More specifically, there may be used a method of mixing the alkoxysilanes with a part of the organic solvent and then with water, and finally mixing the resultant mixture with a remaining part of the organic solvent and the base.

In particular, as the catalyst, there are more preferably used Lewis acids such as hydrochloride acid which is highly volatile and, therefore, readily removable, and aluminum acetylacetone complexes. The amount of the catalyst added is usually 0.001 to 1 mol, preferably 0.01 to 0.1 mol based on 1 mol of the alkoxysilanes. When the amount of the catalyst used is more than 1 mol, precipitates of coarse gelled particles tend to be produced, thereby failing to form a uniform porous silica film.

The raw solution for forming the porous silica film of the present invention is produced by blending the above raw components with each other. The amount of the alkoxysilanes blended is preferably 10 to 60% by weight, more preferably 20 to 40% by weight based on the total weight of the raw solution. When the amount of the alkoxysilanes blended is more than 60% by weight, the porous silica film tends to be broken upon the film-forming process. On the other hand, when the amount of the alkoxysilanes blended is less than 10% by weight, the hydrolysis reaction and dehydration condensation reaction tend to be extremely slow, resulting in deteriorated film-forming property of the solution (unevenness of film thickness).

The amount of water blended is usually 0.01 to 10 times, preferably 0.05 to 7 times, more preferably 0.07 to 5 times the weight of the alkoxysilanes used. When the amount of water blended is less than 0.01 time the weight of the alkoxysilanes, the hydrolysis reaction and condensation reaction may fail to proceed sufficiently, resulting in production of white turbid film. On the other hand, when the amount of water blended is more than 10 times the weight of the alkoxysilanes, a surface tension of the raw solution tends to be extremely large, resulting in poor film-forming property of the solution (cissing of the solution applied).

Water is required for hydrolysis of the alkoxysilanes and further is important from the standpoint of enhancing a film-forming property of the raw solution for producing the aimed porous silica film. The amount of water which is defined by a molar ratio of water to the alkoxide group, is usually 0.1 to 1.6 mol, preferably 0.3 to 1.2 mol, more preferably 0.5 to 0.7 mol based on 1 mol of the alkoxide group contained in the alkoxysilane.

Water may be added at any time after dissolving the alkoxysilanes in the organic solvent, and is preferably added after fully dispersing the alkoxysilanes, the catalyst and other additives in the solvent.

Water used in the present invention may be subjected to any one or both of ion exchange treatment and distillation treatment. When the porous silica film of the present invention is used in application fields which tend to be especially adversely affected by the presence of fine particles, such as semiconductor materials and optical materials, the porous silica film is required to have a high purity. Therefore, in these applications, there is preferably used an ultrapure water obtained by further subjecting distilled water to ion-exchange treatment. In this case, for example, there may be used water obtained by passing through a filter having a mesh size of 0.01 to 0.5 μm.

When the water-containing organic solution contains the hydrophilic organic compound having a boiling point of not less than 80° C., the content of the hydrophilic organic compound having a boiling point of not less than 80° C. is usually not more than 90% by weight, preferably not more than 85% by weight based on the total weight of the organic solvent and the hydrophilic organic compound having a boiling point of not less than 80° C. When the content of the hydrophilic organic compound having a boiling point of not less than 80° C. is more than 90% by weight, the resultant porous silica film tends to suffer from white turbidity during the film-forming process, or tends to be broken.

When the content of the hydrophilic organic compound having a boiling point of not less than 80° C. is too small, the porous silica film tends to exhibit an extremely low porosity, so that it may be difficult to obtain the porous silica film having a low refractive index. In general, the content of the hydrophilic organic compound having a boiling point of not less than 80° C. is usually not less than 30% by weight, preferably not less than 50% by weight, more preferably not less than 60% by weight based on the total weight of the organic solvent and the content of the hydrophilic organic compound having a boiling point of not less than 80° C. Accordingly, the content of the hydrophilic organic compound having a boiling point of not less than 80° C. in the water-containing organic solution is usually 30 to 90% by weight, preferably 50 to 85% by weight, more preferably 60 to 85% by weight based on the total weight of the organic solvent and the content of the hydrophilic organic compound having a boiling point of not less than 80° C.

The temperature of the atmosphere used upon preparation of the coating solution as well as the mixing order of the respective components are optional. In order to obtain a uniform coating solution, water is preferably added finally. Further, in order to suppress excessive hydrolysis reaction and condensation reaction of the silicon alkoxide in the coating solution, the coating solution is prepared at a temperature of usually 0 to 60° C., preferably 15 to 40° C., more preferably 15 to 30° C.

Upon preparation of the coating solution, the stirring operation of the coating solution is also optional. The coating solution is preferably stirred using a stirrer in every mixing operation.

In addition, after completion of preparation of the coating solution, it is preferred that the coating solution is aged to promote the hydrolysis reaction and dehydration condensation reaction of the silicon alkoxides. During the aging period, since it is preferable that the resultant hydrolyzed and condensed product of the silicon alkoxides is uniformly dispersed in the coating solution, the coating solution is preferably continuously stirred.

The temperature used during the aging period is optional. In general, the aging temperature may be a room temperature, or the coating solution may be either continuously or intermittently heated during the aging period. Among them, in order to form a coating film having a three-dimensional nanoporous structure owing to the hydrolyzed and condensed product of the silicon alkoxides, it is preferred that the coating solution is rapidly heat-aged. Further, the heat-aging is preferably initiated immediately after preparing the coating solution, i.e., usually within 15 days, preferably within 12 days, more preferably within 3 days, still more preferably within one day after completion of preparing the coating solution.

More specifically, the coating solution is usually heat-aged at a temperature of 40 to 70° C. for 1 to 5 hours. Upon the heat-aging, the coating solution is preferably stirred to obtain a coating film having a uniform porous structure. In particular, from the standpoint of formation of the porous structure, the coating solution is suitably heat-aged at a temperature near 60° C. for 2 to 3 hours.

The raw solution has a viscosity of usually 0.1 to 1000 cP, preferably 0.5 to 500 cP, more preferably 1 to 100 cP from the standpoint of facilitated production of the coating solution.

(2) Step of Forming a Primary Coating Film From the Thus Prepared Raw Solution:

The primary coating film is formed by applying the water-containing organic solution as the raw solution onto the substrate. Examples of the substrate may include substrates composed of semiconductors such as silicon and germanium, compound semiconductors such as gallium-arsenic and indium-antimony, ceramic substrates and metals, glass substrates, transparent substrate such as synthetic resin substrates, etc.

When forming the porous silica film of the present invention onto the substrate, properties of the resultant porous silica film tend to be influenced by properties of surface of the substrate. In this case, the substrate may be subjected to not only surface-washing but also surface treatments. Examples of the surface-washing of the substrate may include dipping treatments in acids such as sulfuric acid, hydrochloric acid, nitric acid and phosphoric acid, alkalis such as aqueous sodium hydroxide solution, or an oxidative mixed solution containing hydrogen peroxide together with sulfuric acid, hydrochloric acid, ammonia, etc. In particular, in the consideration of a good adhesion to the porous silica film, it is preferred that the surface of the silicon substrate or transparent glass substrate is treated with acids such as sulfuric acid and nitric acid.

As the method of applying the raw solution onto the substrate, there may be used known methods such as a cast-coating method of spreading the raw solution over the substrate using a bar coater, an applicator, a doctor blade, etc.; a dipping method of dipping the substrate in the raw solution and then raising the substrate from the solution; and a spin-coating method. Among these methods, the cast-coating method and spin-coating method are preferred in view of uniform application of the raw solution.

When applying the raw solution by the cast-coating method, the casting speed is usually 0.1 to 1000 m/min, preferably 0.5 to 700 m/min, more preferably 1 to 500 m/min.

When applying the raw solution by the spin-coating method, the spinning speed is usually 10 to 100000 rpm, preferably 50 to 50000 rpm, more preferably 100 to 10000 rpm.

In the dip-coating method, the dipping and raising operations of the substrate may be conducted at an optional speed. The raising speed is usually 0.01 to 50 mm/sec, preferably 0.05 to 30 mm/sec, more preferably 0.1 to 20 mm/sec. The speed for dipping the substrate in the coating solution is not particularly limited, and is preferably substantially identical to the raising speed. The dipping procedure from dipping the substrate in the coating solution until raising the substrate therefrom may be continued for appropriate period of time. The dipping procedure may be continued for a period of usually from 1 sec to 48 hours, preferably from 3 sec to 24 hours, more preferably from 5 sec to 12 hours. The application of the coating solution may be conducted either in air or in an inert gas atmosphere such as nitrogen and argon. The temperature used upon applying the coating solution is usually 0 to 60° C., preferably 10 to 50° C., more preferably 20 to 40° C. The relative humidity in the atmosphere is usually 5 to 90%, preferably 10 to 80%, more preferably 15 to 70%. Meanwhile, since the drying speed used in the dip-coating method is slow as compared to that in the spin-coating method, the dip-coating method tends to form a stable film with a less distortion by sol-gel reaction after applying the coating solution. Accordingly, in some cases, the dip-coating method is more preferred since a film having a well-controlled structure can be produced by the surface treatment of the substrate.

The film-forming temperature is usually 0 to 100° C., preferably 10 to 80° C., more preferably 20 to 70° C.

(3) Step of Polymerizing the Thus Formed Primary Coating Film to Form an Intermediate Film:

The coating film is polymerized, i.e., converted into a higher-molecular compound to form an intermediate film. The polymerization reaction is referred to a so-called sol-gel method, and includes two elementary reactions, i.e., a hydrolysis reaction of the alkoxysilanes and a dehydration condensation reaction between silanol groups produced by the hydrolysis reaction.

The hydrolysis reaction may be caused by addition of water. Water may be added directly in a liquid state, or in the form of an aqueous alcohol solution or water vapor, though not particularly limited thereto. When water is rapidly added, the hydrolysis reaction and dehydration condensation reaction of the alkoxysilanes tend to proceed too rapidly according to kinds of the alkoxysilanes, resulting in precipitation of solids. For this reason, in order to prevent precipitation of solids, a method of adding water for a sufficient period of time, a method of uniformly adding water under the coexistence of an alcohol solvent, a method of adding water at a low temperature to suppress occurrence of undesirable reactions thereupon, etc., may be used singly or in combination thereof.

When the hydrolysis and condensation reactions of the alkoxysilanes proceed by the sol-gel method, the condensed product of the alkoxysilanes is gradually polymerized and converted into a high-molecular compound thereof. In the hydrolysis and condensation reactions, there tend to be caused the phase separation which is considered to occur due to the change in phase equilibrium. However, in the present invention, owing to a good balance between composition of the raw solution and a degree of hydrophilicity of each of the alkoxysilanes and the hydrophilic organic compound having a boiling point of not less than 80° C., the phase separation can be controlled to a nanometer scale. As a result, a separate phase of the hydrophilic organic compound is still held within a network structure of gels composed of the condensed product of the alkoxysilanes upon forming the coating film onto the substrate, thereby forming the intermediate film thereon.

For the above reason, it is important to control the hydrophilicity of the hydrophilic organic compound having a boiling point of not less than 80° C. When the hydrophilicity is expressed by a dielectric constant, the dielectric constant of the hydrophilic organic compound is preferably 10 to 20, more preferably 13 to 19.

In the consideration of a well-balanced degree of the hydrophilicity, the water-containing organic solution as the raw solution preferably contains an organic solvent having a dielectric constant of not less than 23 (more specifically, such as methanol and ethanol). In particular, when the weight ratio of the organic solvent having a dielectric constant of not less than 23 to the hydrophilic organic compound having a boiling point of not less than 80° C. is controlled to preferably from 5:5 to 2:8, more preferably 4:6 to 2:8, it is possible to achieve a more desirable phase separation behavior.

(4) Step of Contacting the Intermediate Film With a Water-soluble Organic Solvent to Form a Porous Silica Film (Extraction Step):

When the intermediate film is contacted with a water-soluble organic solvent, the hydrophilic organic compound contained in the intermediate film is extracted and removed therefrom, and further water contained therein is also removed therefrom. Since water contained in the intermediate film is not only dissolved in the organic solvent but also adsorbed inside of film-constituting substances, in order to effectively remove water from the intermediate film, it is required to control the content of water in the organic solvent. The water content in the organic solvent is usually 0 to 10% by weight, preferably 0 to 5% by weight, more preferably 0 to 3% by weight. When the removal of water from the intermediate film is insufficient, pores of the porous film tend to be eliminated due to breakage thereof or decreased in size upon subjecting the film to subsequent heating or drying step.

Examples of the method of extracting and removing the hydrophilic organic compound contained in the intermediate film may include a method of dipping the intermediate film in a water-soluble organic solvent, a method of washing the surface of the intermediate film with the water-soluble organic solvent, a method of spraying the water-soluble organic solvent onto the surface of the intermediate film, a method of blowing a vapor of the water-soluble organic solvent onto the surface of the intermediate film, etc. Among these methods, preferred are the dipping method and the washing method. The time of contact between the intermediate film and the water-soluble organic solvent is usually from 1 sec to 24 hours. From the standpoint of a good productivity, the upper limit of the contact time is preferably 12 hours, more preferably 6 hours. On the other hand, the lower limit of the contact time is preferably 10 sec, more preferably 30 sec, because it is required to fully remove the hydrophilic organic compound having a boiling point of not less than 80° C. and water from the intermediate film.

(5) Step of Drying the Porous Silica Film:

The drying step is conducted for the purposes of removing residual volatile components form the porous silica film and/or promoting the hydrolysis and condensation reactions of the alkoxysilanes. The drying temperature is usually 20 to 500° C., preferably 30 to 400° C., more preferably 50 to 350° C. The drying time is usually from 1 min to 50 hours, preferably from 3 min to 30 hours, more preferably from 5 min to 15 hours. The porous silica film may be dried by known methods such as an air-blowing method, a drying method under reduced pressure and combination thereof. Meanwhile, when volatile components are rapidly removed due to too strong drying, the porous silica film tends to suffer from cracks.

Therefore, the moderate drying method such as air-blowing is preferably used. The air-blowing method may be followed by drying under reduced pressure in order to fully remove the volatile components from the porous silica film.

Meanwhile, the previous extraction step may be replaced with the present drying step. More specifically, the removal of the hydrophilic organic compound having a boiling point of not less than 80° C. from the intermediate film produced in the above step (3) may be conducted not by the extraction step described in the above step (4) but by the drying step explained in this step.

The laminated substrate which is capable of removing the hydrophilic organic compound by the above drying method, may be produced by such a specific method comprising at least a step of applying a water-containing organic solution containing raw compounds composed mainly of alkoxysilanes to be subjected to hydrolysis and dehydration condensation reactions, and the hydrophilic organic compound having a boiling point of not less than 80° C., onto a substrate to form a primary coating film thereon; a step of subjecting the water-containing organic solution constituting the primary coating film to hydrolysis and dehydration condensation reactions to form an intermediate film; a step of contacting the intermediate film with a catalyst for promoting the hydrolysis and dehydration condensation reactions to form a dense layer in a surface region of the intermediate film; and a step of drying the intermediate film to remove the hydrophilic organic compound having a boiling point of not less than 80° C. therefrom and form the porous silica film.

(E) Substrate:

As the substrate, there may be used those having a refractive index of usually 1.4 to 1.9, preferably 1.45 to 1.70, more preferably 1.47 to 1.65, still more preferably 1.48 to 1.60. When the refractive index of the substrate is more than 1.9, the difference in refractive index between the substrate and air tends to be too large, resulting in increased amount of total reflection light at a boundary surface therebetween. Since the thickness of the substrate is generally more than 100 μm, especially in the application fields of EL displays, large total reflection in the substrate causes the total reflection light to be returned to the light-scattering layer and scattered again therein, resulting in increase in amount of light scattered and emitted therefrom. For this reason, there tends to be caused mixing of emitted light between pixels having a size of not more than 100 μm square, resulting in undesirable phenomenon which tends to cause deterioration of resolution or definition, such as pixel blurring and color blurring.

Meanwhile, for the above reason, the light extraction layer in which light is diffused or scattered is disposed as close to the transparent electrode layer as possible, in particular when used in applications of EL displays. The distance from the transparent electrode layer to the light extraction layer is more preferably not more than 2 times a size of one side of pixel, most preferably not more than the size of one side of pixel.

When the refractive index of the substrate is more than 1.9, a large amount of external light tends to be reflected on the surface of the substrate, resulting in deteriorated resolution or definition of the displays. As to the substrate having a refractive index less than 1.4, there are not available any suitable self-supporting materials for transparent substrates.

The refractive index used herein means an average refractive index in a whole depth direction of the substrate, which is determined by the measurement using an ellipsometer according to ASTM D-542, and is expressed by the value based on a sodium D ray (589.3 nm) at 23° C. Examples of the transparent substrate having the above-specified refractive index may include those transparent substrate composed of materials generally used for this purpose. Specific examples of the material for the transparent substrates may include various shot glasses such as BK7, SF11, LaSFN9, BaK1 and F2; glasses such as synthesized fused silica glass, optical crown glass, heat-resistance borosilicate glass, sapphire, soda glass and no-alkali glass; and synthetic resins, e.g., acrylic resins such as polymethacrylates and crosslinked acrylates, aromatic polycarbonate resins such as bisphenol A polycarbonate, styrene resins such as polystyrene, amorphous polyolefin resins such as polycycloolefins, epoxy resins, polyester resins such as polyethylene terephthalate, polysulfone resins such as polyether sulfone, and polyether imide resins. Among these materials, preferred are shot glasses such as BK7 and BaK1, synthesized fused silica glass, optical crown glass, heat-resistance borosilicate glass, soda glass, no-alkali glass, acrylic resins, aromatic polycarbonate resins and amorphous polyolefin resins, and more preferred are shot glasses such as BK7, synthesized fused silica glass, optical crown glass, heat-resistance borosilicate glass, soda glass, no-alkali glass, acrylic resins, aromatic polycarbonate resins and polyether sulfone resins.

The thickness of the substrate is usually 0.1 to 10 mm. From the standpoints of good mechanical strength and gas-barrier property, the lower limit of the thickness of the substrate is preferably 0.2 mm, more preferably 0.3 mm. Also, from the standpoints of light weight, compactness and light transmittance, the upper limit of the thickness of the substrate is preferably 5 mm, more preferably 3 mm.

The light transmittance of the laminated substrate is preferably not less than 80%, more preferably not less than 85%, still more preferably not less than 90% as measured at a wavelength of sodium D ray (589.3 nm).

(F) Protective Cover:

The material for the protective cover is not particularly limited as long as it can be formed into a transparent flat sheet. Examples of the material for the protective cover may include, in addition to the above-mentioned various glass materials and resin materials used for the substrate, transparent coating materials having no self-supporting property, e.g., UV-curable or thermosetting acrylic resins, sol-gel reactive materials (silicate materials), etc. The thickness of the protective cover is usually 10 to 1000 μm, preferably 100 to 200 μm.

(G) Other Layers:

The electroluminescent device may also be provided with known hole injection layer and hole transporting layer between the electroluminescent layer and the transparent electrode layer, and further with known electron injection layer and electron transporting layer between the electroluminescent layer and the cathode. In addition, if required, the electroluminescent device may be provided on a light extraction side of the substrate, with films or membranes such as an anti-reflection film, a polarizing film and a phase difference film.

Figure 1:
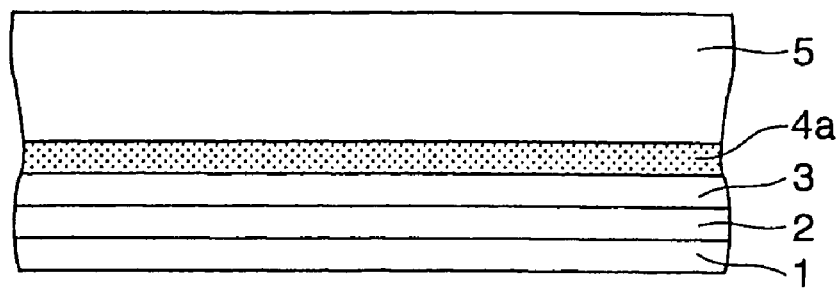
FIG. 1(*a*) is an explanatory view showing a layer structure of an electroluminescent device according to the first invention, and FIG. 1(*b*) is an explanatory view of total reflection of light having a large incident angle to substrate from transparent electrode.
Figure 1:
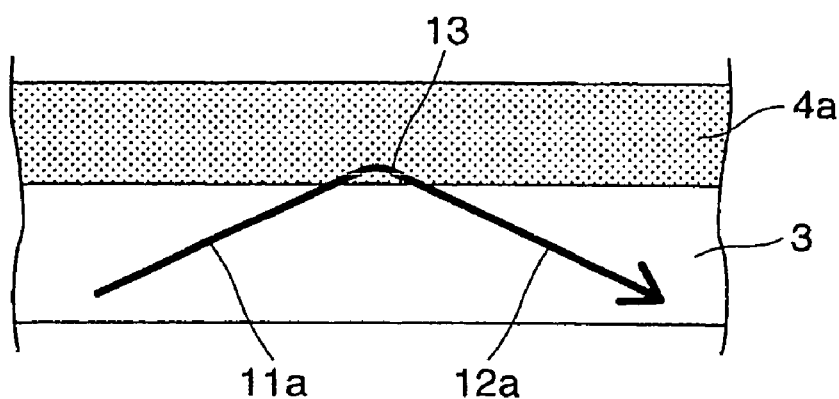
Figure 2:
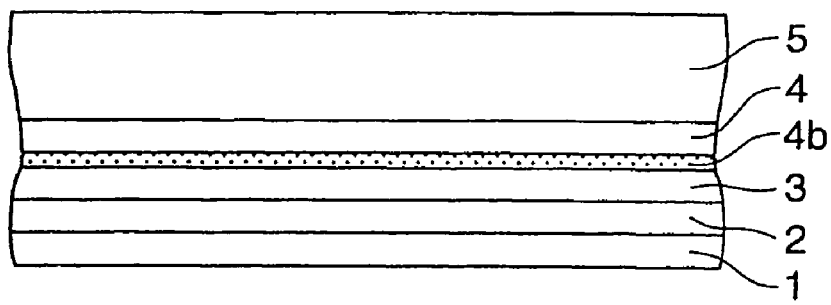
FIG. 2 is an explanatory view showing another layer structure of an electroluminescent device according to the first invention.
Figure 3:
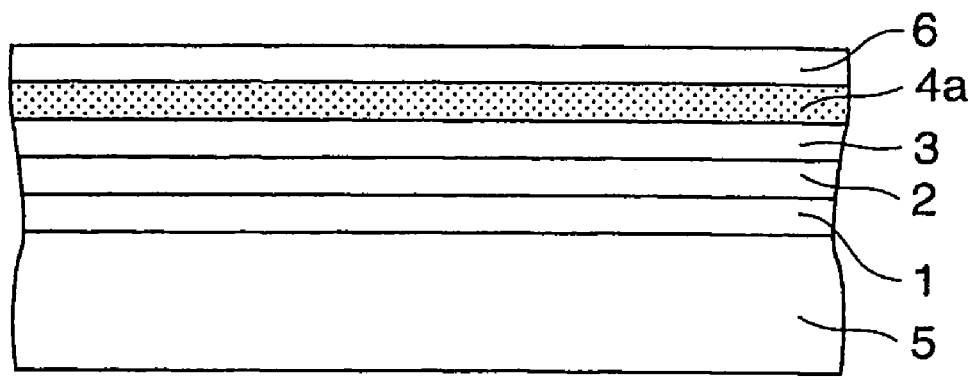
FIG. 3 is an explanatory view showing the other layer structure of an electroluminescent device according to the first invention.
Figure 4:
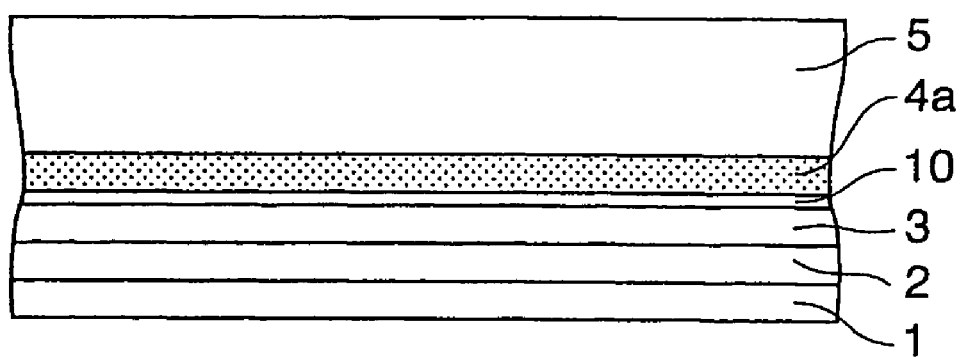
FIG. 4 is an explanatory view showing a layer structure of an electroluminescent device according to the second invention.
Figure 5:
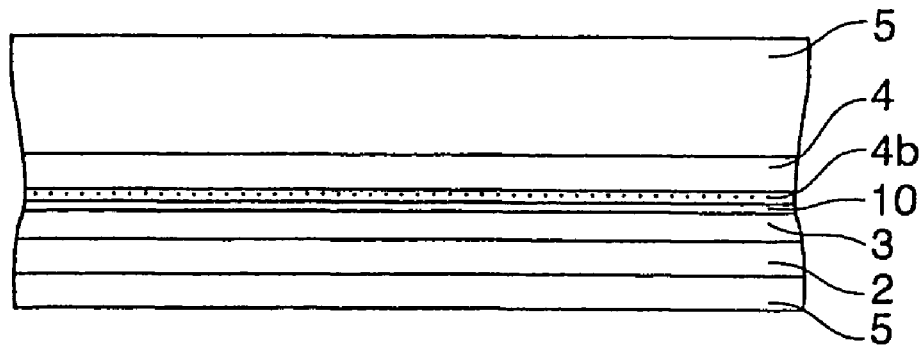
FIG. 5 is an explanatory view showing another layer structure of an electroluminescent device according to the second invention.
Figure 6:
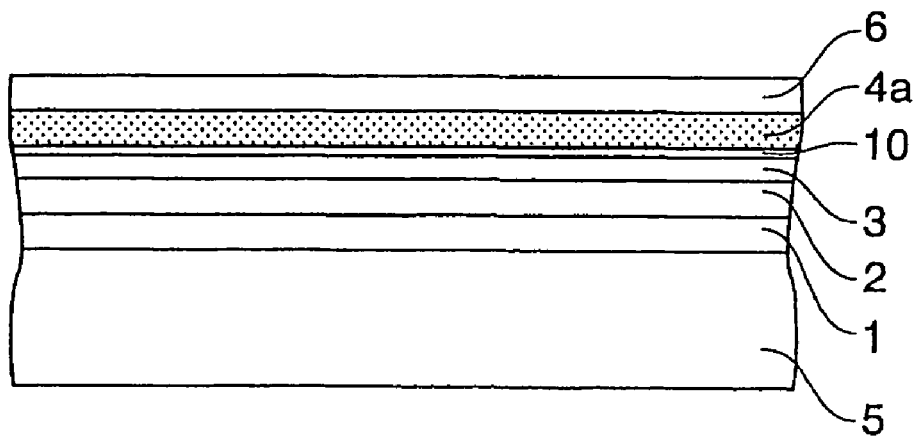
FIG. 6 is an explanatory view showing the other layer structure of an electroluminescent device according to the second invention.
Figure 7:
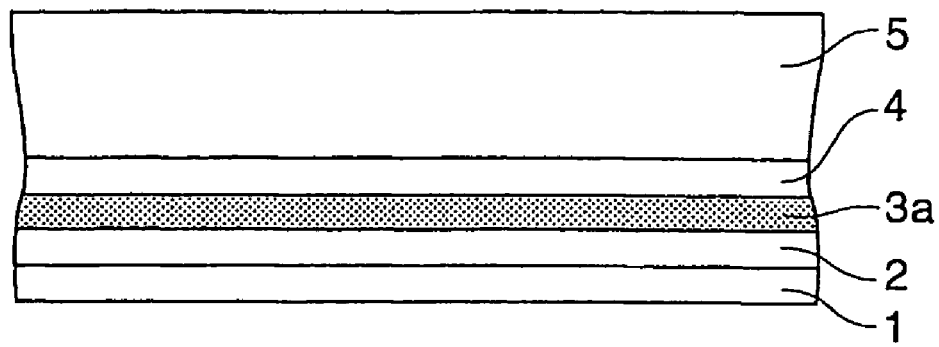
FIG. 7 is an explanatory view showing a layer structure of an electroluminescent device according to the third invention.
Figure 8:
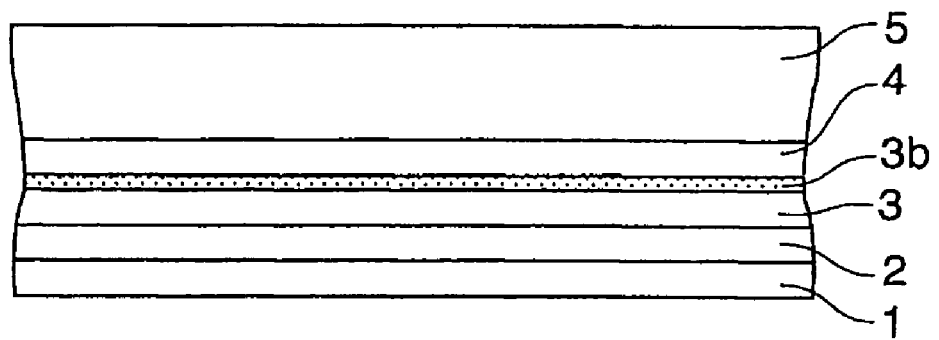
FIG. 8 is an explanatory view showing another layer structure of an electroluminescent device according to the third invention.
Figure 9:
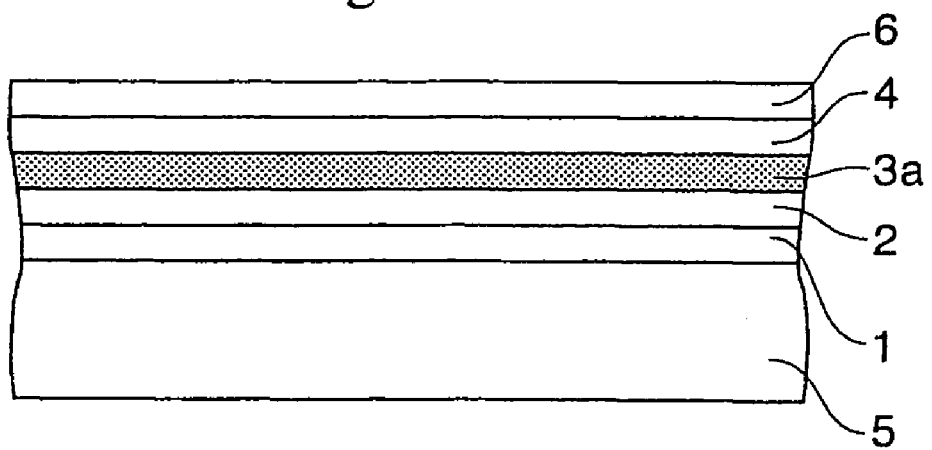
FIG. 9 is an explanatory view showing the other layer structure of an electroluminescent device according to the third invention.
Figure 10:
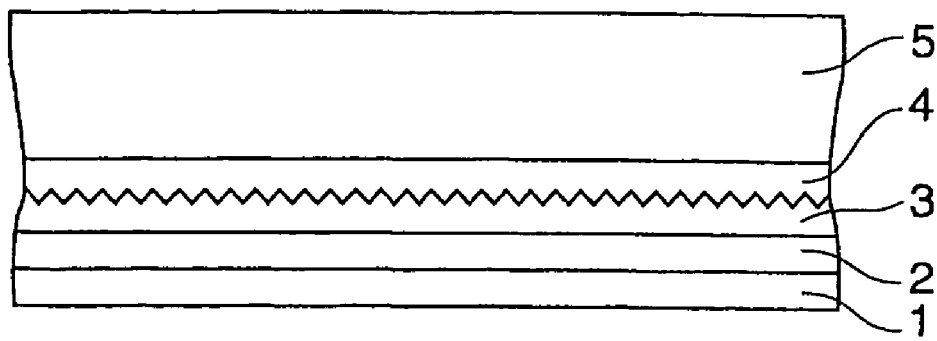
FIG. 10 is an explanatory view showing a layer structure of an electroluminescent device according to the fourth invention.
Figure 11:
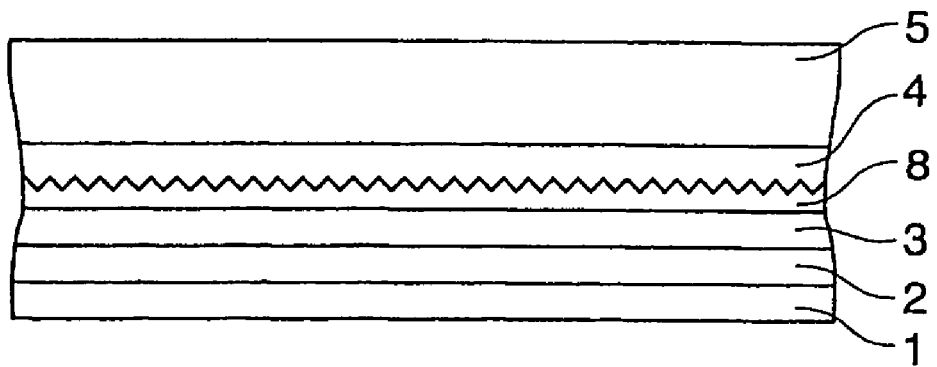
FIG. 11 is an explanatory view showing another layer structure of an electroluminescent device according to the fourth invention.
Figure 12:
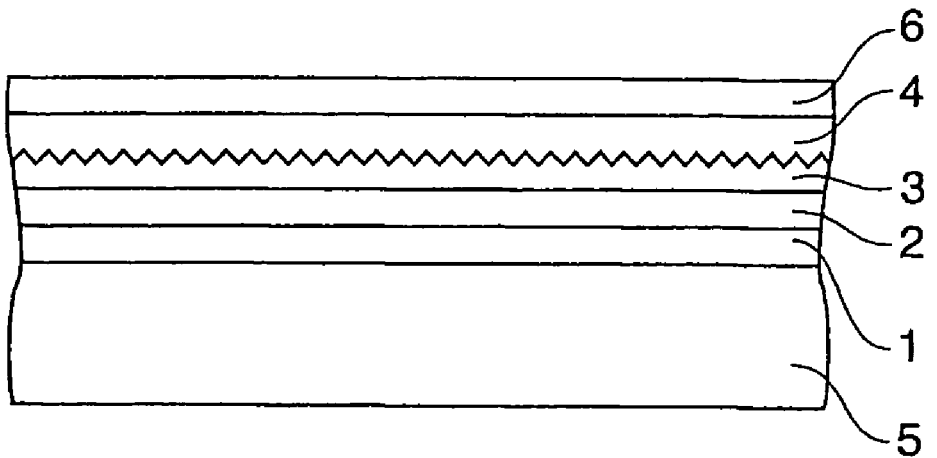
FIG. 12 is an explanatory view showing the other layer structure of an electroluminescent device according to the fourth invention.

Next, the electroluminescent device of the present invention is explained by referring to the accompanying drawings. FIG. 1(*a*) is an explanatory view showing a layer structure of an electroluminescent device according to the first invention, and FIG. 1(*b*) is an explanatory view of total reflection of light having a large incident angle to substrate from transparent electrode. FIGS. 2 and 3 are explanatory views showing other layer structures of an electroluminescent device according to the first invention. FIG. 4 is an explanatory view showing a layer structure of an electroluminescent device according to the second invention. FIGS. 5 and 6 are explanatory views showing other layer structures of an electroluminescent device according to the second invention. FIG. 7 is an explanatory view showing a layer structure of an electroluminescent device according to the third invention. FIGS. 8 and 9 are explanatory views showing other layer structures of an electroluminescent device according to the third invention. FIG. 10 is an explanatory view showing a layer structure of an electroluminescent device according to the fourth invention. FIGS. 11 and 12 are explanatory views showing other layer structures of an electroluminescent device according to the fourth invention.

<First Invention>

The electroluminescent device shown in FIG. 1(a) (embodiment (1)) has such a layer structure in which a cathode 1, an electroluminescent layer 2, a transparent electrode layer 3, an evanescent light-scattering layer A 4a and a transparent substrate 5 are successively laminated on each other in this order.

The evanescent light-scattering layer A 4a is a layer composed of a matrix composed of a low-refractive material and light-scattering particles. As the material of the matrix, there may be used the materials exemplified as those for above-exemplified low-refractive layer. Examples of the light-scattering particles contained in the evanescent light-scattering layer A 4a may include silica (refractive index: 1.46), colloidal silica (refractive index: 1.3 to 1.4, which varies depending upon production method and structure of the device), titania (refractive index: 2.4 to 2.7, which varies depending upon amorphous or crystalline state of the layer), zirconia (refractive index: 2.0), ITO (indium tin oxide; refractive index: 1.8 to 1.9, which varies depending upon composition or crystalline state of the layer), ATO (antimony tin oxide; refractive index: 1.9), alumina (refractive index: 1.8), etc. In particular, there may be suitably used those particles which exhibit as low a light absorption in visible range as possible, i.e., a high transparency, and has as large a difference in refractive index from that of the matrix as possible.

In the present invention, the difference between refractive indices of the matrix and the light-scattering particles dispersed in the matrix is important, and it is not important that one of the matrix and the light-scattering particles has a larger refractive index than that of the other. Although the particles having a smaller refractive index than that of the matrix, e.g., fine air bubbles, are usable in the present invention, there are usually used such particles having a larger refractive index than that of the matrix. The difference between refractive indices of the matrix and the light-scattering particles is usually not less than 0.1, preferably not less than 0.3, more preferably not less than 0.5, still more preferably not less than 0.9. The upper limit of the difference between refractive indices of the matrix and the light-scattering particles is not present in principle, but usually about 1.5 in the consideration of availability of materials therefor.

Meanwhile, in order to incorporate the light-scattering particles into the matrix, the particles may be simply added to the raw solution upon the step (1) of preparing the raw solution for forming the porous silica film as the low-refractive layer.

The size and shape of the light-scattering particles are not particularly limited as long as the particles have a function of diffusing or scattering an evanescent light (in some cases, referred to as "evanescent wave" or "near-field light"). That is, it is important that the light-scattering particles exhibit a function of preventing the evanescent light from being returned to the transparent electrode layer and allowing the light to enter into a light extraction side (on the side of the transparent sheet/plate). The amount of the evanescent light (evanescent light penetration distance) is usually from about 100 to about 600 nm, calculated as the distance measured from a boundary surface between the transparent electrode and the evanescent light-scattering layer A toward the side of the evanescent light-scattering layer A. Therefore, it is important that the light-scattering particles are present within such a region, and have a diameter capable of exhibiting the light scattering function. In particular, the light-scattering particles preferably have the size and shape capable of causing mie scattering.

For example, the particle size of the light-scattering particles as an optical size thereof is usually larger than $1/20\ \lambda$, preferably larger than $1/10\ \lambda$ (wherein $\lambda$ is a wavelength of light to be scattered (usually a visible light having a wavelength of 400 to 700 nm)). When the particle size is too large, the light scattering film layer tends to be deteriorated in flatness. If the light scattering film layer shows such a poor flatness, the electric field within the EL light-emitting layer tends to become non-uniform, resulting in problems such as deteriorated luminance and short life of the device.

When the particle size is too small, the particles may fail to show a good light-scattering effect, resulting in increase in refractive index of the matrix in the low-refractive layer. For the above reasons, the physical particle size calculated as a particle size of the particles corresponding to weight ratio of not less than 60% (hereinafter occasionally referred to as "60%-weight ratio particle size") is usually 20 to 400 nm, preferably 40 to 200 nm, more preferably 60 to 120 nm.

The 60%-weight ratio particle size is measured as follows.

(1) The section of the scattering layer was observed by FIB-SEM.

FIB is an abbreviation of a focus ion beam processing/observing apparatus. As the FIB apparatus, there was used "FB-2000A" manufactured by Hitachi Limited. Upon processing the section, Pt (platinum)-sputter film was formed before the FIB processing.

Before producing the section by FIB, a W (tungsten) film was locally formed at its corresponding position, and an observation hole (about 20 μm×30 μm square) was formed by FIB. Thus, the surface to be observed was finished by lowering the ion beam current. Ion species used were $Ga^+$, and acceleration voltage for ion beam was controlled to 30 kV.

The SEM observation was conducted using "S4100" manufactured by Hitachi Limited. The observation condition was controlled such that the acceleration voltage was 5.0 kV, and the sample film was inclined at an angle of about 80° from the vertical direction (which corresponds to such a condition that the section of the film was observed substantially from a front side thereof) to photograph an image of the observation surface of the hole formed by FIB at a magnification of 10000 times (×10000).

The obtained photo image of the section observed were examined by the following procedure.

The images having a width of 20 μm in the plane direction of the scattering film were randomly collected from 20 positions on the sample film, and the particle sizes of the particles observed in the images were measured. When a sectional shape of the particle is distorted, the particle size of such a particle having a circular sectional shape with substantially the same area as that of the particle to be observed is regarded as the particle size of the distorted particle.

As to the respective particles thus observed, the weight of the particles was calculated assuming that the third power of the particle size is proportional to the weight of the particle, and the particle size of particles corresponding to not less than 60% by weight of the whole particles was determined.

Meanwhile, the agglomerated massive particles were respectively regarded as a single particle.

If the above procedure was not applicable because of brittleness of the scattering film or unclear particle shape upon SEM or TEM observation, the particle size was measured by the following method.

Meanwhile, this evaluation method is also applicable to the case where the particles are fine voids.

(2) Upon preparing the coating solution before forming the scattering film, a suspension of the particles was subjected to measurement of a particle size distribution thereof using a particle size distribution analyzer.

As the particle size distribution analyzer, there was used a "MICROTEC particle size distribution analyzer Model 9230" manufactured by Nikkiso Co., Ltd. The solvent used for suspending the particles is not particularly limited as long as the particles are well suspended therein. In the case where the film formation is conducted by the sol-gel method in which titania particles are dispersed in a silicate solution, alcohol-based solvents may be suitably used.

From the thus measured particle size distribution, data concerning the particle size, frequency and cumulative ratios are obtained. Assuming that the particle size is regarded as that of substantially spherical particles, the 60%-weight ratio particle size was determined from the data by the same method as above.

The thickness of the evanescent light-scattering layer is preferably not less than 2 times an average particle size of the light-scattering particles. Thus, by suitably controlling the particle size and the thickness of the evanescent light-scattering layer, the particles can effectively exhibit the light-scattering effect.

The average particle size of the particles is expressed by the value corresponding to 50 vol % thereof, which is determined from the particle size distribution measured by the above method (FIB-SEM method, or the method of measuring the particle size distribution of the dispersion containing the particles in the case where the FIB-SEM method is not applicable).

The content of the light-scattering particles in the evanescent light-scattering layer is usually 1 to 40% by volume, preferably 5 to 20% by volume. When the content of the particles is too small, the evanescent light-scattering layer may fail to exhibit a sufficient light-scattering effect. When the content of the particles is too large, the evanescent light-scattering layer tends to show a too high hiding effect, resulting in a less amount of light extracted.

The thickness of the evanescent light-scattering layer A is usually not less than 2 times the average particle size of the light-scattering particles. When the particle size and the thickness of the evanescent light-scattering layer are thus controlled, the particles can efficiently exhibit a light-scattering effect. More specifically, the thickness of the evanescent light-scattering layer A is usually from 100 to 1000 nm, preferably 300 to 700 nm. As a matter of course, the thickness of the evanescent light-scattering layer A is controlled such that the light-scattering particles are present within the range where the evanescent light is penetrated. More specifically, although it varies depending upon the thickness of the evanescent light-scattering layer A containing the light-scattering particles and the wavelength used, it is important that the light-scattering particles are present within usually 1 μm (1000 nm), preferably within 600 nm from the boundary surface between the layer A and the transparent electrode layer. In particular, it is more preferred that not less than one-third (weight ratio) of the light-scattering particles are present within 600 nm from the boundary surface between the layer A and the transparent electrode layer.

When the thickness of the evanescent light-scattering layer A is too small, the thickness of the light scattering layer (abundance of the particles contained within the evanescent light penetration region) tends to be smaller as compared to the below-mentioned evanescent light penetration distance, resulting in insufficient light-scattering effect. When the thickness of the evanescent light-scattering layer A is too large, although the light scattering is conducted without problems, the too large thickness tends to be disadvantageous from the standpoints of flatness of the layer and prevention of cracks therein. Meanwhile, the boundary surface between the evanescent light-scattering layer A and the transparent electrode is preferably a flat surface. This is because the transparent electrode film formed by a vacuum method (which means a vacuum vapor deposition method, etc.) is directly adversely affected by roughness present on the underlying coat.

More specifically, in order to produce uniform and stable light, it is required to maintain a uniform electric field within the electroluminescent layer. If roughness are present on the transparent electrode, the electric field within the electroluminescent layer tends to become non-uniform, resulting in deterioration in EL pigments and, therefore, causing defects such as dark spots.

Next, the total reflection at the boundary surface between the transparent electrode layer and the evanescent light-scattering layer A in the electroluminescent device is explained by referring to FIGS. 1(a) and 1(b).

The light produced in the electroluminescent layer 2 is emitted to a side of the transparent electrode layer 3 directly or after being reflected on the cathode 1 and then passed through the electroluminescent layer 2. Next, the light entering into the evanescent light-scattering layer A 4a is incident onto a boundary surface between the transparent substrate 5 and the evanescent light-scattering layer A 4a at an incident angle substantially perpendicular to the surface of the transparent substrate 5. Therefore, the total reflection at a boundary surface between the transparent substrate 5 and an outside air layer is decreased. Further, the light-scattering particles contained in the evanescent light-scattering layer A 4a serves for reducing total reflection of the evanescent light passing through the boundary surface between the transparent electrode layer 3 and the evanescent light-scattering layer A 4a, resulting in enhancement of the light extraction efficiency.

More specifically, among the light which is emitted from the electroluminescent layer 2 and passed through the transparent electrode layer 3 and then is incident onto the boundary surface between the transparent electrode layer 3 and the evanescent light-scattering layer A 4a, the light having an incident angle smaller than the critical angle directly enters into the evanescent light-scattering layer A 4a from the transparent electrode layer 3. On the other hand, the light 11a having an incident angle larger than the critical angle is penetrated through the boundary surface and then undergoes total reflection, and is returned as a total reflection light 12a to the transparent electrode layer 3. Upon the total reflection, the light is penetrated on the side of the evanescent light-scattering layer A 4a relative to the boundary surface, so that the electric field and magnetic field of the incident light also extend from the boundary surface and are present on the side of the evanescent light-scattering layer A 4a. The maximum penetration distance of the evanescent light 13 is substantially 500 to 600 nm in the direction perpendicular to the transparent electrode when the thickness of the transparent electrode layer is 100 nm and the refractive index of the evanescent light-scattering layer A 4a is 1.3.

The evanescent light 13 penetrated on the side of the evanescent light-scattering layer A 4a is scattered by the light-scattering particles which are present in the vicinity of the boundary surface of the evanescent light-scattering layer A 4a. As a result, the evanescent light 13 is captured into the side of the evanescent light-scattering layer A 4a containing the light-scattering particles without being returned as a total reflection light to the transparent electrode layer 3. The light captured into the side of the evanescent light-scattering layer A 4a containing the light-scattering particles is scattered by the light-scattering particles and diffused, and then scattered into the evanescent light-scattering layer A 4a containing the light-scattering particles directly or after being reflected, for example, by an aluminum reflection film of the cathode. As a result, the reflectance of the total reflection light at the boundary surface is decreased, so that a larger amount of light enters into the evanescent light-scattering layer A 4a from the transparent electrode layer 3, resulting in enhancement in light extraction efficiency of the electroluminescent device.

The electroluminescent device shown in FIG. 2 (embodiment (2)) has such a layer structure in which a cathode 1, an electroluminescent layer 2, a transparent electrode layer 3, an evanescent light-scattering layer A 4b, a low-refractive layer 4 and a transparent substrate 5 are laminated on each other in this order.

The refractive index of a matrix component of the evanescent light-scattering layer A 4b is substantially identical to that of the low-refractive layer 4.

Meanwhile, the "substantially identical refractive index" used herein means that the difference between refractive indices of the layers to be compared, for example, the difference between the refractive index of the matrix component of the evanescent light-scattering layer A 4b and the refractive index of the low-refractive layer 4 is usually not more than 0.3, preferably not more than 0.2, more preferably not more than 0.1.

As the materials of the low-refractive layer 4 and the matrix component of the low-refractive layer 4b (evanescent light-scattering layer A 4b), there may be used the same material as used for the matrix component (other than the particles) of the evanescent light-scattering layer A 4a shown in FIG. 1(a). In particular, the matrix component of the evanescent light-scattering layer A 4b preferably has the same composition as that of the low-refractive layer 4, though both may be different from each other.

The thickness of the low-refractive layer 4 is usually 100 to 1000 nm, preferably 300 to 700 nm from the standpoints of evanescent light penetration distance upon total reflection at the boundary surface, flatness of the film or prevention of cracks. The thickness of the evanescent light-scattering layer A 4b is usually 100 to 1000 nm, preferably 300 to 700 nm.

The content of the light-scattering particles in the evanescent light-scattering layer A 4b is the same as the content of the light-scattering particles in the evanescent light-scattering layer A 4a as described above.

In the electroluminescent device of the embodiment (2), the total reflection at the boundary surface between the transparent electrode layer 3 and the low-refractive layer 4b is decreased similarly to the electroluminescent device of the embodiment (1). More specifically, in the case where the light passing from the electroluminescent layer 2 through the transparent electrode layer 3 is incident onto the boundary surface between the transparent electrode layer 3 and the evanescent light-scattering layer A 4b at an incident angle larger than the critical reflection angle, the light is penetrated through the boundary surface to the side of the evanescent light-scattering layer A 4b, and undergoes total reflection.

Upon the total reflection, similarly to the case shown in FIG. 1(b), the light is penetrated to the side of the evanescent light-scattering layer A 4b relative to the boundary surface, so that the electric field or magnetic field of the incident light is also present on the side of the evanescent light-scattering layer A 4b relative to the boundary surface.

Since the particles capable of scattering the evanescent light are present in a portion of the evanescent light-scattering layer A 4b near the boundary surface, the light penetrated to the side of the evanescent light-scattering layer A 4b is scattered by the particles. As a result, the light is directly or indirectly scattered in the evanescent light-scattering layer A 4b without being returned as a total reflection light to the side of the transparent electrode layer 3. Thus, by incorporating the light-scattering particles in the evanescent light-scattering layer A 4b, the reflectance of total reflection light is lowered, so that a larger amount of light enters from the transparent electrode layer 3 to the evanescent light-scattering layer A 4b.

Since the matrix component of the evanescent light-scattering layer A 4b and the low-refractive layer 4 are substantially identical in refractive index to each other, no total reflection is caused at the boundary surface between the evanescent light-scattering layer A 4b and the low-refractive layer 4. As a result, the light entering from the transparent electrode layer to the evanescent light-scattering layer A 4b and then reaching the boundary surface between the evanescent light-scattering layer A 4b and the low-refractive layer 4, substantially directly enters into the low-refractive layer 4, resulting in enhancement in light extraction efficiency of the electroluminescent device.

In the electroluminescent device shown in FIG. 3, a cathode 1 is formed on a substrate 5, and on the cathode 1 are successively provided an electroluminescent layer 2, a transparent electrode layer 3 and an evanescent light-scattering layer A 4a. On the evanescent light-scattering layer A 4a is further provided a protective cover 6 as a transparent sheet/plate. Meanwhile, in this embodiment, the substrate 5 may not be transparent, and the protective cover exhibits an optical function as the transparent substrate used in the embodiment (1). The device of the embodiment (1) is referred to as "bottom emission-type EL" whereas the device of the embodiment shown in FIG. 3 is referred to as "top emission-type EL".

Also, in the electroluminescent device (top emission type) shown in FIG. 3, a low-refractive layer 4 containing no particles may be an air layer (voids) without problems concerning a structure of the device. In this case, since the refractive index of the air layer is 1.0, the thickness thereof is not particularly limited because the air layer is free from problems concerning flatness of the film and prevention of cracks.

The embodiment shown in FIG. 3 is different from the embodiment shown in FIG. 1 in that the substrate 5 is disposed on the side of the cathode 1. Also, in the embodiment shown in FIG. 2, the substrate 5 may be disposed on the side of the cathode 1.

In the present invention, the guided light in the transparent electrode layer is extracted by using light scattering phenomenon. Therefore, by positively utilizing a wavelength dependence of the light scattering efficiency, the light extraction efficiency of a specific color can be increased, and a life of light emitting pigment for the specific color can be prolonged.

For example, when rayleigh scattering or combination of mie scattering and rayleigh scattering is used while varying the particle size or refractive index of the particles, a sufficient scattering efficiency is ensured, so that a blue color light can be extracted with a high efficiency.

Further, when the material whose refractive index is rapidly raised near blue color light in visible range, for example, titania, is selectively used in the composition of the particles, it becomes possible to extract a blue color light at a higher efficiency as compared to the other color lights.

Meanwhile, on the contrary, for example in the case where air bubbles having a size corresponding to that of the particles are dispersed, since the refractive index of air undergoes substantially no change due to wavelength, it may be more effective to suppress the wavelength dependence of the light extraction efficiency.

In the electroluminescent device for emission of white color light or full color light, in general, pigments on the short wavelength side have a lower luminance, or exhibit a shorter half life of luminance when light having the same luminance is emitted. For this reason, for example, if the extraction efficiency for blue color light can be enhanced, it is not required to design such a configuration in which only an area occupied by blue pigments is increased. As a result, it is possible to enhance a luminance per unit area, and decrease a current flowing through the blue pigments, thereby improving the life of pigments. Also, in the applications using a white light source, by improving the extraction efficiency of blue color light and life of pigments therefor, it is possible to minimize an amount of offset from white color upon measurement.

Meanwhile, in the top emission type according to the embodiment shown in FIG. 3, it is required to form the transparent electrode layer and the light extraction layer after forming the electroluminescent layer. In this case, since the electroluminescent layer tends to be decreased in emission luminance due to crystallization or deterioration thereof upon exposure to a temperature as high as not less than 100° C., the treating temperature used upon formation of the light extraction layer is usually not more than 150° C., preferably not more than 120° C., more preferably not more than 100° C., and the pressure of the treating atmosphere is generally an ordinary pressure.

In the above method, in the case where the low-refractive layer is formed from a porous silica material, there is preferably used such a film-forming process in which formation of a porous structure is conducted, for example, using a mold composed of the above high-boiling hydrophilic organic compound at a relatively low temperature.

As an alternative method, there may be used such a method in which after previously successively forming the low-refractive layer, if required, and the evanescent light-scattering layer A on a separate transparent substrate such as a plastic film, the resultant optical film is attached onto the transparent electrode to form a light extraction film. When the optical film is attached onto the transparent electrode, the evanescent light-scattering layer A also acts as a bonding layer or an adhesive layer. In such a method, the processes requiring the heating or use of organic solvents has been already completed upon production of the film, so that the light extraction layer can be formed without damaging the electroluminescent layer.

As the transparent substrate such as plastic films, there may be suitably used any substrates as long as the substrates are composed of a transparent flexible material. Examples of the suitable substrate may include PET (polyethylene terephthalate) film, PEN (polyethylene naphthalate) film, PES (polyether sulfone) film, PC (polycarbonate) film, APO (amorphous polyolefin, cyclic polyolefin) film, etc., though not particularly limited thereto.

The transparent substrate may be used as the protective cover shown in FIG. 3. In addition, the transparent substrate film may be provided mainly on the light emission side thereof with a functional layer such as a gas-barrier layer, an anti-reflection layer and a circular polarizer layer, if required.

The transparent substrate film is first formed thereon with the low-refractive layer, if required. When the transparent substrate is composed of a plastic film, since formation of the porous silica film on the transparent substrate cannot be conducted at a temperature higher than 200° C., the above attaching method can be suitably used therefor.

<Second Invention>

In the electroluminescent device shown in FIG. 4 (embodiment (3)), a barrier layer 10 is disposed between the transparent electrode layer 3 and the evanescent light-scattering layer A 4a of the electroluminescent device according to the embodiment (1). More specifically, the electroluminescent device of the embodiment (3) has such a layer structure in which a cathode 1, an electroluminescent layer 2, a transparent electrode layer 3, the barrier layer 10, an evanescent light-scattering layer A 4a and a transparent substrate 5 are successively laminated on each other in this order.

Further, as the electroluminescent device of the embodiment (3), there may be exemplified the embodiment A using a high-refractive barrier layer having a refractive index identical to or higher than that of the transparent electrode layer, and the embodiment B using a low-refractive barrier layer having a refractive index lower than that of the transparent electrode layer.

In the embodiment A, since the barrier layer 10 has a refractive index identical to or higher than that of the transparent electrode layer 3, the light entering from the transparent electrode layer 3 into the barrier layer 10 undergoes no total reflection. Examples of the material constituting the barrier layer 10 may include $ZrO_2$, $TiO_2$, $Al_2O_3$, $CeO_2$, $TiN$, $Ta_2O_3$, $Ta_2O_5$, $SiO_xN_y$, $SiN$, $SiO_x$, $SnO_2$, $Sb_2O_5$, $Y_2O_3$, $La_2O_3$, $In_2O_3$, and mixtures thereof. These materials are usable as long as they exhibit no or less visible light absorption and have a dense film structure. In particular, those materials mainly composed of inorganic compounds can be suitably used. In this embodiment, since the barrier layer 10 has a refractive index identical to or higher than that of the transparent electrode layer 3, a part of the guided light is transferred from the transparent electrode layer to the barrier layer. In this case, the material of the barrier layer preferably exhibits a less light absorption in a visible light wavelength range than the material of the transparent electrode layer. The maximum absorption of the barrier layer in a visible light range is more preferably not more than 5%, still more preferably not more than 3%, most preferably not more than 1% per a thickness of 100 nm. Under the consideration in which the above thickness is replaced with a guided light penetration distance, even though a light absorption per guided light penetration distance of 100 nm is several %, if the guided light penetration distance in a plane of the transparent electrode layer or the barrier layer reaches several microns or more (in general, the size of one pixel used in EL displays reaches several ten microns square or more), the light absorption is very large and, therefore, cannot be ignored for the purpose of enhancing the light extraction efficiency. Accordingly, by using the barrier layer having a refractive index identical to or higher than that of the transparent electrode layer 3 and exhibiting a less light absorption in a visible light wavelength range, it can be expected to attain, in addition to the barrier effect, such an effect of enhancing the light extraction efficiency.

The thickness of the barrier layer 10 is not particularly limited, and is usually not less than 20 nm, preferably not less than 50 nm, more preferably 100 nm in order to fully exhibit a barrier property thereof. Also, in order to suppress a light absorption, the upper limit of the thickness of the barrier layer is usually 1000 nm, preferably 400 nm.

In the embodiment B, the barrier layer 10 has a refractive index lower than that of the transparent electrode layer 3. Examples of the material constituting the low-refractive barrier layer having a ver small thickness may include fluoride materials such as $MgF_2$ and NaF, various porous materials such as $SiO_2$ and nano-porous silica, and mixtures thereof. The thickness of the barrier layer is very small, more specifically, is usually not more than 500 nm, preferably not more than 300 nm, more preferably not more than 200 nm. Meanwhile, in the consideration of prevention of scattering, the lower limit of the thickness of the barrier layer is usually 20 nm, preferably 50 nm, more preferably 100 nm. In the embodiment B, the light coming from the side of the transparent electrode layer 3 tends to undergo total reflection at the boundary surface between the low-refractive barrier layer 10 and the transparent electrode layer 3. Further, since the thickness of the barrier layer is small, upon the total reflection, the evanescent light penetration region from the boundary surface reaches not only the barrier layer 10 but also the evanescent light-scattering layer A 4a. As a result, the evanescent light is scattered by the particles contained in the evanescent light-scattering layer A 4a, and extracted therein. When the thickness of the barrier layer is larger than the above upper limit, the evanescent light fails to reach the evanescent light-scattering layer A 4a, so that the light extraction efficiency is not sufficiently increased.

In the case where the barrier layer has refractive index identical to or higher than that of the transparent electrode layer and exhibits a less light absorption than in visible light range than that of the transparent electrode layer, a part of the guided light in the transparent electrode layer is transferred into the barrier layer, and attenuation of the guided light is decreased. Therefore, it is expected to attain such an effect of enhancing the light extraction efficiency. In this case, the upper limit of the thickness of the barrier layer is determined without particularly considering the evanescent light penetration distance. However, in the case where the film is formed by a vacuum process, when the film thickness is more than 1000 μm, the resultant film tends to become brittle or tends to be peeled off by itself. For these viewpoints, the thickness of the barrier layer is preferably not more than 500 nm.

Also, in the case of a wet-coating film, when the film thickness is more than 10 μm, it may be difficult to ensure flatness required for EL devices. From this viewpoint, the thickness of the wet-coating film as the barrier layer is preferably not more than 5 μm, more preferably not more than 3 μm, most preferably not more than 1 μm.

The barrier layer may be produced, for example, by vapor deposition method.

The barrier layer serves for preventing diffusible substances contained in the low-refractive layer, e.g., low-molecular components such as residual monomers and water from being transferred into the side of the transparent electrode layer. For example, since the evanescent light-scattering layer A 4a is preferably produced by hydrolysis of alkoxysilanes, the resultant evanescent light-scattering layer A 4a tends to contain residual low-molecular components such as monomers or oligomers of the alkoxysilanes, solvents, water and catalysts. Further, in some cases, upon assembling processes of EL devices, low-molecular substances or migratable substances tend to be mixed therein from outside and remain therein. These low-molecular substances exhibit a diffusing property, so that there tend to be caused such a risk that these substances are penetrated through the transparent electrode layer 3 and adversely affect the electroluminescent layer. The barrier layer serves for preventing the diffusion of such substances and protecting the transparent electrode layer or the electroluminescent layer.

In the electroluminescent device of the embodiment (3), the total reflection at the boundary surface between the barrier layer 10 and the evanescent light-scattering layer A 4a is decreased similarly to the above embodiment (1). In the case where the light passing from the electroluminescent layer 2 through the transparent electrode layer 3 and the barrier layer 10 is incident onto the boundary surface between the barrier layer 10 and the evanescent light-scattering layer A 4a at an incident angle larger than the critical angle, the light undergoes total reflection at the boundary surface. Upon the total reflection, similarly to the first invention, there is caused such a phenomenon that the light is penetrated to the side of the evanescent light-scattering layer A 4a relative to the boundary surface. As a result, the electric field or magnetic field of the incident light is also present on the side of the evanescent light-scattering layer A 4a relative to the boundary surface.

Since the particles capable of scattering the evanescent light are present in a portion of the evanescent light-scattering layer A 4a near the boundary surface, the light penetrated to the side of the evanescent light-scattering layer A 4a is scattered by the particles. As a result, the light is directly or indirectly scattered in the evanescent light-scattering layer A 4a without being returned as total reflection light to the side of the barrier layer 10. Thus, by incorporating the light-scattering particles in the evanescent light-scattering layer A 4a, a reflectance of the total reflection is decreased, so that a larger amount of light enters from the barrier layer 10 to the evanescent light-scattering layer A 4a. As a result, the electroluminescent device is enhanced in light extraction efficiency.

In the electroluminescent device shown in FIG. 5 (embodiment (4)), a barrier layer 10 is disposed between the transparent electrode layer 3 and the evanescent light-scattering layer A 4b of the electroluminescent device according to the embodiment (2). More specifically, the electroluminescent device of the embodiment (4) has such a layer structure in which a cathode 1, an electroluminescent layer 2, a transparent electrode layer 3, the barrier layer 10, an evanescent light-scattering layer A 4b, a low-refractive layer 4 and a transparent substrate 5 are successively laminated on each other in this order.

The barrier layer 10 may have both structures shown in the embodiments A and B of the embodiment (3).

In the electroluminescent device of the embodiment (4), in the case of the embodiment A in which the barrier layer 10 has a refractive index identical to or higher than that of the transparent electrode layer 3, the total reflection of light at the boundary surface between the barrier layer 10 and the evanescent light-scattering layer A 4b is decreased similarly to the embodiment A of the embodiment (3).

Since the refractive index of the matrix of the evanescent light-scattering layer A 4b is substantially identical to that of the low-refractive layer 4, no total reflection is caused at the boundary surface between the evanescent light-scattering layer A 4b and the low-refractive layer 4. As a result, the light entering from the side of the transparent electrode layer to the evanescent light-scattering layer A 4b reaches the boundary surface between the evanescent light-scattering layer A 4b and the low-refractive layer 4, and then enters into the low-refractive layer 4 substantially without change. Consequently, the electroluminescent device is enhanced in light extraction efficiency.

Also, in the embodiment (4), the barrier layer 10 may exhibit a low refractive index and have a very small thickness similarly to the embodiment B of the embodiment (3). In this case, similarly to the embodiment A, the light extraction efficiency can be enhanced.

FIG. 6 shows an electroluminescent device of a top emission type as shown in the embodiment (3). In this embodiment, a cathode 1 is formed on a substrate 5, and on the cathode 1 are successively provided an electroluminescent layer 2, a transparent electrode layer 3, a barrier layer 10 and an evanescent light-scattering layer A 4a. On the evanescent light-scattering layer A 4a is further provided a protective cover 6. Optically, the protective cover has a function as the substrate of the embodiment (3).

Meanwhile, only in the electroluminescent device of a top emission type as shown in FIG. 6 in which the substrate 5 is disposed on the side of the cathode 1, the low-refractive layer 4 containing no particles may be replaced with an air layer (voids) without problems concerning a structure of the device. In this case, the refractive index of the air layer is 1.0. Also, the upper limit of the thickness of the air layer is not particularly limited because the air layer is free from problems concerning flatness of the film and prevention of cracks.

The electroluminescent device shown in FIG. 6 is of a top emission type in which the substrate 5 of the embodiment (3) is disposed on the side of cathode 1. In the embodiment (4), the device may also be of a top emission type in which the substrate 5 is similarly disposed on the side of the cathode.

Meanwhile, in the second invention, the thickness of the transparent electrode may be determined so as to satisfy the above light transmittance and sheet resistivity value. Specifically, the thickness of the transparent electrode is preferably 10 to 500 nm, and the lower limit thereof is more preferably 50 nm, still more preferably 100 nm in the consideration of a good conductivity. On the other hand, in the consideration of light transmittance as well as prevention of peeling-off of film layers and cracks in the film, the upper limit of the thickness of the transparent electrode is more preferably 300 nm, still more preferably 200 nm.

<Third Invention>

The electroluminescent device shown in FIG. 7 (embodiment (5)) has such a layer structure in which a cathode 1, an electroluminescent layer 2, a transparent electrode layer 3a containing light-scattering particles, a low-refractive layer 4 and a transparent substrate 5 are successively laminated on each other in this order.

The transparent electrode layer 3a containing light-scattering particles is a layer in which the light-scattering particles are dispersed in a matrix of the transparent electrode. As the matrix, there may be used the materials for the transparent electrode layer as described previously.

The transparent electrode layer 3a containing light-scattering particles may be produced by such a coating method of applying a raw solution containing the light-scattering particles. Examples of the coating solution for forming the transparent electrode layer 3a containing light-scattering particles may include a coating solution prepared by dispersing fine particles of conductive materials such as ITO or semiconductor materials together with conductive polymers or other resin binders in an organic solvent, the conductive polymers by themselves, etc., though not particularly limited thereto. In order to incorporate the light-scattering particles in the above matrix, the particles may be merely added to the coating solution. Using the coating solution, patterns required as an electrode for the electroluminescent device are formed by a printing method such as a photo-lithographic method and an ink-jet printing method. Meanwhile, after patterning, the resultant patterns have a line width of usually about 1 to 10 μm, though not particularly limited thereto. The thickness of the transparent electrode layer containing light-scattering particles is not particularly limited as long as it is substantially identical to the thickness of the transparent electrode layer described previously, and is preferably 2 times or more the average particle size of the light-scattering particles.

As the particles contained in the transparent electrode layer 3a containing light-scattering particles, there may be used the same light-scattering particles as contained in the above evanescent light-scattering layer A.

The content of the light-scattering particles in the transparent electrode layer is usually 0.1 to 40% by volume, preferably 1 to 10% by volume. When the content of the light-scattering particles is too small, it is not possible to attain a sufficient light scattering effect. When the content of the light-scattering particles is too large, the light extraction efficiency tends to be deteriorated because of the high hiding effect.

In the electroluminescent device of the embodiment (5), the transparent electrode layer 3a containing light-scattering particles serves for increasing an amount of light entering from the transparent electrode layer 3a containing light-scattering particles into the low-refractive layer 4 and thereby enhancing the light extraction efficiency in the following manner. That is, among the light which is incident to the boundary surface between the transparent electrode layer 3a containing light-scattering particles and the low-refractive layer 4, the light having an incident angle smaller than the critical angle directly enters from the transparent electrode layer 3a containing light-scattering particles into the low-refractive layer 4. On the other hand, the light having an incident angle larger than the critical angle undergoes total reflection at the boundary surface facing the low-refractive layer 4, and then returned to the transparent electrode layer 3a containing light-scattering particles. A part of the light thus returned to the transparent electrode layer 3a containing light-scattering particles is scattered by the particles contained in the transparent electrode layer 3a containing light-scattering particles. Further, a part of the scattered light is incident again onto the boundary surface facing the low-refractive layer 4. Among the scattered light being incident again onto the boundary surface facing the low-refractive layer 4, the light having an incident angle smaller than the critical angle enters from the transparent electrode layer 3a containing light-scattering particles into the low-refractive layer 4 without undergoing total reflection. Among the scattered light being incident again onto the boundary surface, the light having an incident angle larger than the critical angle is returned again to the side of the transparent electrode layer 3a containing light-scattering particles, and a part of the light thus returned is scattered again by the particles. When this operation is repeated, a remaining part of the light also gradually enters into the side of the low-refractive layer 4.

Among the light subjected to total reflection at the boundary surface between the low-refractive layer 4 and the transparent electrode layer 3a containing light-scattering particles, the light reaching the boundary surface between the electroluminescent layer 2 and the transparent electrode layer 3a containing light-scattering particles undergoes total reflection when the incident angle thereof to this boundary surface is larger than the critical angle, and proceed again toward the boundary surface between the low-refractive layer 4 and the transparent electrode layer 3a containing light-scattering particles. Thereafter, the behavior of the light is the same as described above, i.e., the light gradually enters into the low-refractive layer 4.

On the other hand, the light which is incident onto the boundary surface between the transparent electrode layer 3a containing light-scattering particles and the electroluminescent layer 2 from the side of the transparent electrode layer 3a containing light-scattering particles at an incident angle smaller than the critical angle directly enters into the electroluminescent layer 2, and then is reflected on the boundary surface between the electroluminescent layer 2 and the cathode 1. The reflected light is penetrated again through the electroluminescent layer 2 and the transparent electrode layer 3a containing light-scattering particles, and returned to the boundary surface between the transparent electrode layer 3a containing light-scattering particles and the low-refractive layer 4. Thereafter, the behavior of the light is the same as described above.

Thus, in this embodiment, the total reflection on the side of the transparent electrode layer relative to the low-refractive layer 4 is decreased, resulting in enhancement of light extraction efficiency.

The electroluminescent device shown in FIG. 8 (embodiment (6)) has such a layer structure in which a cathode 1, an electroluminescent layer 2, a transparent electrode layer 3, an evanescent light-scattering layer B 3b, a low-refractive layer 4 and a transparent substrate 5 are successively laminated on each other in this order.

The refractive index of a matrix component of the evanescent light-scattering layer B 3b is substantially identical to that of the transparent electrode layer 3. For example, in the embodiment (6), the difference between refractive indices of the matrix component of the evanescent light-scattering layer B 3b and the transparent electrode layer 3 is usually not more than 0.3, preferably not more than 0.2, more preferably not more than 0.1.

As the matrix material of the evanescent light-scattering layer B 3b in the embodiment (6), there may be used the same material as that of the transparent electrode layer 3. Also, although the matrix component of the evanescent light-scattering layer B 3b preferably has the same composition as that of the transparent electrode layer 3, both may be different in composition from each other.

The evanescent light-scattering layer B 3b used in the embodiment (6) may be formed by the same method as the method for producing the transparent electrode layer 3 used in the embodiment (5). The transparent electrode layer 3 containing no particles may be formed by using a coating solution containing no particles, or may also be formed by a film-forming process such as vapor deposition and sputtering.

The thickness of the transparent electrode layer 3 used in the embodiment (6) is generally 2 times or more the average particle size of the light-scattering particles, and is usually 100 to 5000 nm, preferably 200 to 1000 nm. The thickness of the evanescent light-scattering layer B 3b is usually 100 to 5000 nm, preferably 200 to 1000 nm.

As the particles contained in the evanescent light-scattering layer B 3b, there may be used the same light-scattering particles as used in the above evanescent light-scattering layer A.

The content of the light-scattering particles in the evanescent light-scattering layer B 3b is usually 0.1 to 40% by volume, preferably 1 to 10% by volume. When the content of the particles is too small, the evanescent light-scattering layer B 3b may fail to exhibit a sufficient light-scattering effect. When the content of the particles is too large, the evanescent light-scattering layer B 3b tends to show a too high hiding effect, resulting in a poor light extraction efficiency thereof.

In the electroluminescent device of the embodiment (6), the evanescent light-scattering layer B 3b which is disposed between the transparent electrode layer 3 and the low-refractive layer 4 serves for increasing an amount of light entering from the transparent electrode layer 3 into the low-refractive layer 4 and enhancing the light extraction efficiency as follows. That is, since the refractive index of the matrix of the evanescent light-scattering layer B 3b is substantially identical to that of the transparent electrode layer 3, no total reflection is caused at the boundary surface between the transparent electrode layer 3 and the evanescent light-scattering layer B 3b.

Among the light which enters from the transparent electrode layer 3 into the evanescent light-scattering layer B 3b, passes through the evanescent light-scattering layer B 3b and then is incident onto the boundary surface between the evanescent light-scattering layer B 3b and the low-refractive layer 4, the light having an incident angle smaller than the critical angle directly enters from the evanescent light-scattering layer B 3b into the low-refractive layer 4, whereas the light having an incident angle larger than the critical angle undergoes total reflection at the boundary surface facing to the low-refractive layer 4, and then returned to the evanescent light-scattering layer B 3b. A part of the light thus returned to the evanescent light-scattering layer B 3b is scattered by the particles contained in the evanescent light-scattering layer B 3b. Further, a part of the scattered light is incident again onto the boundary surface facing to the low-refractive layer 4. Among the scattered light being incident again onto the boundary surface facing to the low-refractive layer 4, the light having an incident angle smaller than the critical angle enters from the evanescent light-scattering layer B 3b into the low-refractive layer 4 without undergoing total reflection. Among the scattered light being incident again onto the boundary surface, the light having an incident angle larger than the critical angle is returned again to the side of the evanescent light-scattering layer B 3b, and a part of the light thus returned is scattered again by the particles. When this operation is repeated, a remaining part of the light also gradually enters into the side of the low-refractive layer 4.

Among the light undergoing total reflection at the boundary surface between the low-refractive layer 4 and the evanescent light-scattering layer B 3b, the light reaching the boundary surface between the evanescent light-scattering layer B 3b and the transparent electrode layer 3 directly enters into the transparent electrode layer 3 owing to no difference in refractive index therebetween, and is returned to the boundary surface between the transparent electrode layer 3 and the electroluminescent layer 2. The light which is incident onto the boundary surface at an incident angle larger than the critical angle, undergoes total reflection at the boundary surface, and proceeds again toward the boundary surface between the low-refractive layer 4 and the evanescent light-scattering layer B 3b. Thereafter, the behavior of the light is the same as described above, so that the light gradually enters into the low-refractive layer 4.

On the other hand, the light being incident onto the boundary surface between the transparent electrode layer 3 and the electroluminescent layer 2 from the side of the transparent electrode layer 3 at an incident angle smaller than the critical angle directly enters into the electroluminescent layer 2, and then is reflected on the boundary surface between the electroluminescent layer 2 and the cathode 1. The reflected light is penetrated again through the electroluminescent layer 2 and the transparent electrode layer 3, and returned to the boundary surface between the transparent electrode layer 3 and the evanescent light-scattering layer B 3b. Thereafter, the behavior of the light is the same as described above.

Thus, also, in the electroluminescent device of the embodiment (6), the total reflection on the side of the transparent electrode layer 3 relative to the low-refractive layer 4 is decreased, resulting in enhanced light extraction efficiency thereof.

Meanwhile, the evanescent light-scattering layer B 3b provided in the embodiment (6) may be replaced with a particle-containing layer whose matrix is composed of a material having substantially the same refractive index as that of the transparent electrode layer 3 containing no particles. Examples of the matrix material may include aromatic resins such as polyether sulfones, and those resins having a good transparency which are obtained by dispersing fine particles of a high-refractive material such as titania and zirconia in the aromatic resins. Examples of the material of the light-scattering particles may include titania, zirconia, silica, air, etc. These particles may be dispersed in a size capable of scattering the light.

In the embodiments (5) and (6), the substrate 5 is disposed as an outermost surface layer as viewed from the side of the electroluminescent layer 2 (bottom emission type). Alternatively, the substrate may be disposed on an outside of the cathode, and a protective cover may be disposed as an outermost surface layer as viewed from the side of the electroluminescent layer 2 (top emission type).

FIG. 9 shows a top emission type of the embodiment (5) in which a cathode 1 is formed on a substrate 5, and on the cathode 1 are successively formed an electroluminescent layer 2, a transparent electrode layer 3, an evanescent light-scattering layer B 3b, and a low-refractive layer 4 on which a protective cover 6 is further provided. The embodiment shown in FIG. 9 has such a structure in which the substrate 5 in the embodiment (5) is disposed on the side of the cathode 1. Also, in the embodiment (6), the substrate 5 may be disposed on the side of the cathode 1.

<Fourth Invention>

The electroluminescent device shown in FIG. 10 (embodiment (7)) has such a layer structure in which a cathode 1, an electroluminescent layer 2, a transparent electrode layer 3, a low-refractive layer 4 and a transparent substrate 5 are successively laminated on each other in this order, and a light-scattering rough surface is provided at a boundary surface between the low-refractive layer 4 and the transparent electrode layer 3.

In order to form the boundary surface between the low-refractive layer 4 and the transparent electrode layer 3 into such a light-scattering rough surface, after forming the low-refractive layer 4, the surface thereof is subjected to treatment for forming roughness thereon, and then the transparent electrode layer 3 is formed on the thus formed rough surface of the low-refractive layer 4.

Examples of the method of forming the roughness on the low-refractive layer 4 may include a method of subjecting the surface of the low-refractive layer thus formed to corona treatment, plasma treatment, blast treatment, etc., to form a coarsely etched surface, a method of physically transferring an rough surface pattern on the surface of the low-refractive layer, a method of rubbing the surface of the low-refractive layer with the rough surface, a method of forming the low-refractive layer while contacting with the rough surface, or a method of applying or embedding fine particles having a size capable of scattering light into the surface of the low-refractive layer by any suitable method.

After subjecting the low-refractive layer 4 to the treatment for forming roughness on the surface thereof, the transparent electrode layer 3 is uniformly formed on the rough surface. Therefore, the transparent electrode layer 3 is preferably formed by a coating method of applying a raw coating solution on the rough surface of the low-refractive layer 4.

As the composition of the coating solution for forming the transparent electrode layer 3, there may be used, for example, those compositions prepared by dispersing ITO fine particles together with conductive polymers or other resin binders in an organic solvent, or conductive polymer materials, though not particularly limited thereto.

Using the coating solution, patterns required as an electrode of the electroluminescent device are formed by a photolithographic method, an ink-jet printing method, etc. The line width of the respective patterns is normally about 1 to 10 μm, though not particularly limited thereto.

In the embodiment (7), since the boundary surface between the transparent electrode layer 3 and the low-refractive layer (which may be omitted in some cases) is formed into a light-scattering rough surface, total reflection on the boundary surface is decreased, so that an amount of light entering from the transparent electrode layer 3 into the low-refractive layer 4 is increased, resulting in enhanced light extraction efficiency. In order to fully decrease the total reflection, the surface roughness Ra of the boundary surface is usually 5 to 200 nm, preferably 10 to 100 nm, more preferably 20 to 50 nm.

The surface roughness Ra of the boundary surface is usually about 5 to 200 nm, preferably about 10 to 100 nm, more preferably about 20 to 50 nm; and Rmax thereof is usually about 30 to 600 nm, preferably about 50 to 500 nm, more preferably about 100 to 300 nm.

The surface roughness parameters Ra and Rmax may be evaluated using a probe-type surface roughness meter "KLA-Tencor P-15 Model" manufactured by KLA-Tencor Inc., according to the method prescribed in JIS B 0601. In the measurement, one scanning distance is usually 0.5 μm, and an average value obtained from three scanning operations is regarded as the measured value.

The shape and size of roughness formed on the coarse surface are not particularly limited as long as the surface has a function of scattering light. The size of roughness formed on the coarse surface is more than 1/10 of a wavelength of light to be scattered thereon (usually 400 to 700 nm because of visible light). In general, when the size of roughness is up to several times the wavelength, the light scattering efficiency is increased with increase in size of the roughness. However, when the size of the roughness is too large, a coating layer formed thereon tends to be deteriorated in flatness.

In the electroluminescent device of the embodiment (7), since the boundary surface between the transparent electrode layer 3 and the low-refractive layer is formed into a light-scattering rough surface, total reflection at the boundary surface is decreased, so that an amount of light entering from the transparent electrode layer 3 to the low-refractive layer 4 directly or indirectly after reflection on the cathode, is increased, resulting in enhanced light extraction efficiency. More specifically, the guided light on the side of light-emitting layer relative to the transparent electrode layer is extracted from the light-scattering coarse surface (rough surface), refracted in the direction near perpendicular to the transparent substrate through the low-refractive layer, and then enters into the transparent substrate, thereby preventing total reflection at a boundary surface between the transparent substrate and the air layer.

The electroluminescent device shown in FIG. 11 (embodiment (8)) has such a layer structure in which a cathode 1, an electroluminescent layer 2, a transparent electrode layer 3c, a high-refractive layer 8, a low-refractive layer 4 and a transparent substrate 5 are successively laminated on each other in this order, and a light-scattering rough surface is provided at a boundary surface between the low-refractive layer 4 and the high-refractive layer 8.

The refractive index of the high-refractive layer 8 is substantially identical to that of the transparent electrode layer 3c. More specifically, the difference between refractive indices of the high-refractive layer 8 and the transparent electrode layer 3c is usually not more than 0.3, preferably not more than 0.2, more preferably not more than 0.1.

The composition of the high-refractive layer 8 may be the same as or difference from that of the transparent electrode layer 3c. As the composition of the high-refractive layer 8 which is different from that of the transparent electrode layer 3c, there may be exemplified compositions having a good transparency which are prepared by dispersing fine particles (nanoparticles) of high-refractive materials such as ATO (antimony tin oxide), ITO, zirconia and titania in a high-refractive resin such as polyether sulfone resins and polyether imide resins, or resin materials containing these resins. These compositions is preferably dissolved or dispersed in an organic solvent to form a coating solution thereof.

The high-refractive layer 8 is preferably formed by the coating method similarly to the transparent electrode layer 3 in the embodiment (7). The reason why the coating method is preferred is that the boundary surface of the transparent electrode facing to the side of the electroluminescent layer is required to have a good flatness. The coating method enables formation of the flat surface by filling roughness of the underlying layer. In a vacuum process such as vapor deposition and sputtering, the roughness of the underlying layer tends to be readily reflected onto the surface of the upper layer, so that it may be difficult to form a surface having a good flatness. Meanwhile, the reason why the boundary surface of the transparent electrode facing to the side of the electroluminescent layer is required to have a good flatness, is that a uniform electric field is to be produced within the electroluminescent layer. If the electric field is non-uniform, EL pigments tends to be deteriorated, resulting in defects such as dark spots. The transparent electrode layer 3c may be formed by the same coating method as used for formation of the above transparent electrode layer 3, or by a film-forming process such as vapor deposition and sputtering.

The thickness of the transparent electrode layer 3c is substantially identical to that of the above transparent electrode layer 3. For example, the thickness of the high-refractive layer 8 is usually 100 to 3000 nm, preferably 500 to 1000 nm in the consideration of facilitated film formation and flattening of roughness on the underlying layer.

In the electroluminescent device of this embodiment, since the boundary surface between the high-refractive layer 8 and the low-refractive layer 4 is formed into a light-scattering rough surface, the total reflection on the boundary surface is decreased, so that an amount of light entering from the side of the transparent electrode layer 3c into the low-refractive layer 4 is increased, resulting in enhanced light extraction efficiency. The range of surface roughness of the rough boundary surface is substantially identical to that shown in FIG. 7.

In the embodiments (7) and (8), the substrate 5 is disposed as an outermost surface layer as viewed from the side of the electroluminescent layer 2 (bottom emission type). However, as shown in FIG. 12, the substrate may be disposed outside of the cathode, and a protective cover may be disposed as an outermost surface layer as viewed from the side of the electroluminescent layer 2 (top emission type). In the top emission type embodiment shown in FIG. 12, a cathode 1 is formed on a substrate 5, and on the cathode 1 are successively formed an electroluminescent layer 2, a transparent electrode layer 3, and a low-refractive layer 4 on which a protective cover 6 is further provided. Meanwhile, in this embodiment, the substrate 5 is not necessarily transparent. Optically, the protective cover used in this embodiment exhibits a function of the transparent substrate in the embodiment (7). Also, only in this embodiment, the low-refractive layer may be replaced with air itself (voids) without problems concerning a structure of the device.

The embodiment shown in FIG. 12 has such a structure in which the substrate 5 in the embodiment (7) is disposed on the side of the cathode 1. Also, in the embodiment (8), the substrate 5 may be disposed on the side of the cathode 1.

EXAMPLES

The present invention is described in more detail by Reference Examples corresponding to Examples, but the Reference Examples are only illustrative and not intended to limit the scope of the present invention. Meanwhile, in the following Reference Examples and Comparative Examples, neither cathode nor electroluminescent layer were formed, and a fluorescent pigment layer was formed on a transparent electrode layer. The fluorescent pigment layer was irradiated with excitation light to extract a fluorescence from the side of a substrate and measure an amount of light extracted using a fluorescence spectrometer/luminance meter manufactured by Hitachi Ltd., in the following procedure. That is, excitation light having a wavelength of not more than 400 nm was irradiated on a rear surface (the side on which fluorescent pigment was vapor-deposited) of the obtained laminate, from the side of the fluorescent pigment layer, and an intensity of the extracted light having a wavelength of 420 to 750 nm was measured by a detector disposed in the direction of 45° as an incident angle to substrate from transparent electrode on the surface facing a glass substrate to obtain a light emission energy integrated as to a whole wavelength. The measurement was conducted using a fluorescence spectrometer/luminance meter "F-4500 Model" manufactured by Hitachi Ltd. Meanwhile, the light emission energy as measured was expressed by the relative value on the basis of the result obtained in Comparative Example 1.

The average particle size was measured by FIB-SEM method.

The refractive index was measured using an "ellipsometer" (manufactured by "Sopra") on the basis of Standard D542. However, in the case where it was difficult to measure a refractive index of the matrix portion composed of a meso (nano)-porous material or a particle-dispersed material using the "ellipsometer", the refractive index was measured at 25° C. by a laser having a wavelength of 633 nm using "PRISM COUPLER MODEL 2010" manufactured by Metricon Inc., USA.

Reference Examples 1 to 5

These Reference Examples were conducted for explaining the first invention.

Reference Example 1

Corresponding to Embodiment (1)

A glass plate having a thickness of 0.7 mm and a size of 75 mm square which was composed of a non-alkali glass "AN100" produced by Asahi Glass Co., Ltd., was immersed in 0.1N nitric acid for about one hour to subject the surface thereof to degreasing treatment, washed with pure water and then dried in an oven at 60° C., thereby obtaining a glass substrate 1.

Separately, a small amount of an acid catalyst (aluminum acetylacetonate) was added to a mixed solution containing 30% by weight of an oligomer of tetramethoxysilane ("MS51" produced by Mitsubishi Chemical Corporation), 50% by weight of BtOH, 8% by weight of desalted water and 12% by weight of MeOH, and then silica fine particles having an average particle size of 120 nm and containing particles having a particle size of from 70 to 150 nm in an amount of not less than 60% by weight, were added to the resultant solution such that the weight ratio of the silica fine particles to MS51 was 10%. The resultant mixture was stirred at 60° C. for 3 hours, and allowed to stand for one week for aging.

The thus obtained coating solution was applied onto the glass substrate 1 using a dip coater. The coated glass substrate was dried for 15 min, immersed in methanol for 5 min, taken out and dried for 5 min, and then heated-in an oven at 150° C. for 15 min, thereby forming an evanescent light-scattering layer A 4a thereon. Meanwhile, upon the dip-coating, a protective film was attached onto a rear surface of the substrate, and peeled off after coating, thereby forming the coating film on only one surface thereof.

It was confirmed that the thickness of the thus obtained evanescent light-scattering layer A 4a was 600 nm and had a structure in which light-scattering particles were overlapped on each other in about five layers. As a result of measuring a refractive index of a matrix portion of the evanescent light-scattering layer A 4a using an ellipsometer manufactured by "Sopra", it was confirmed that the refractive index was 1.27 at a wavelength of 550 nm. Further, as a result of measuring the refractive index using "PRISM COUPLER MODEL 2010" manufactured by Metricon Inc., USA., in which a laser having a wavelength of 633 nm was used, it was confirmed that the refractive index was 1.29.

The thickness of a vapor-deposited film or a sputtered film was measured by time management from a calibration curve or a quartz oscillation-type film thickness meter. The thickness of the coating film was measured by a light interference-type thickness meter or by measuring the step formed by scratching the film. The thickness of a thick plate such as a glass substrate was measured using micro-calipers, etc.

Cold sputtering process was conducted to form a 1000 Å-thick ITO transparent electrode 3 on the evanescent light-scattering layer A 4a, and then a 1000 Å-thick film composed of ALQ3 (aluminum quinoline complex: pigment emitting a green fluorescence) was vapor-deposited on the ITO transparent electrode layer. As a result, it was confirmed that the refractive index of the ITO layer was 1.9.

Further, it was confirmed that the amount of light extracted from the above device was 170% when expressed by a relative value on the basis of the amount of light extracted in the below-mentioned Comparative Example 1.

Comparative Example 1

Corresponding to the Prior Art Shown in FIG. 14

The same procedure as defined in Reference Example 1 was conducted except that no silica fine particles were added to the coating solution for forming the evanescent light-scattering layer, thereby producing a fluorescent device having a layer structure corresponding to that shown in FIG. 14, and measuring the amount of light extracted therefrom by the same method.

Comparative Example 2

Corresponding to the Prior Art Shown in FIG. 13a

The same procedure as defined in Reference Example 1 was conducted except that the evanescent light-scattering layer was omitted, thereby producing a fluorescent device having a layer structure corresponding to that shown in FIG. 13a, and measuring the amount of light extracted therefrom by the same method.

As a result, it was confirmed that the amount of light extracted from the above device was 91% on the basis of that in Comparative Example 1.

Reference Example 2

Corresponding to Embodiment (2) Shown in FIG. 2

The coating solution containing no silica fine particles used in Comparative Example 1 was coated to form a low-refractive layer 4 having a thickness of 500 nm, and further the coating solution containing silica fine particles used in Reference Example 1 was applied onto the low-refractive layer to form an evanescent light-scattering layer 4b having a thickness of 600 nm thereon.

On the evanescent light-scattering layer 4b, cold sputtering process was conducted by the same method as defined in Reference Example 1, thereby forming a 1000 Å-thick ITO transparent electrode layer, and further a 1000 Å-thick ALQ3 layer was vapor-deposited on the ITO transparent electrode layer.

As a result, it was confirmed that the amount of light extracted from the above device was 190% on the basis of that in Comparative Example 1.

Reference Example 3

A glass substrate was prepared by the same method as defined in Reference Example 1. A coating solution was prepared as follows. That is, a small amount of an acid catalyst (aluminum acetylacetonate) was added to a mixed solution containing 30% by weight of "MS51" (oligomer of tetramethoxysilane) produced by Mitsubishi Chemical Corporation, 50% by weight of butyl alcohol, 8% by weight of desalted water and 12% by weight of methanol. In this case, titania particles having an average particle size of 200 nm were previously dispersed in butyl alcohol such that the weight percentage of the titania particles in the resultant particle-containing layer was 8% by weight. Meanwhile, the weight percentage of the particles in the particle-containing layer was measured by the same method as used above for measurement of the particle size distribution in the film. The conversion of volume into weight was conducted by measuring a density of the particles and a matrix of the layer. In the case where the matrix was porous, the density was calculated from X-ray reflectance or refractive index measured. The resultant mixed solution was stirred at 60° C. for 3 hours, and allowed to stand for one week for aging.

The thus aged coating mixed solution was applied onto the glass substrate by the same method as defined in Reference Example 1. As a result, it was confirmed that the thickness of the particle-containing low-refractive layer (evanescent light-scattering layer) was 500 nm, and the refractive index of the matrix portion thereof was 1.40.

Under this condition, the light transmittance in the direction perpendicular to the substrate was measured and compared with the light transmittance in the direction perpendicular to the substrate as described in Reference Example 1 to measure an amount of light scattered. The measurement of the light transmittance was conducted using an ultraviolet/visible light absorptiometer "HP8453 Model" manufactured by Hewlett Packard Inc.

Also, in order to ascertain a good flatness of the surface itself (free from scattering on the surface), the surface roughness was measured using a probe-type surface roughness tester "P-15 Model" manufactured by KLA-Tencor Inc. As a result of the measurement using a scanning distance of 0.5 μm, it was confirmed that the surface roughness Ra was 4 nm.

The thus obtained laminate was subjected to cold sputtering process by the same method as defined in Reference Example 1 to form a 1000 Å-thick ITO transparent electrode thereon. Further, a 1000 Å-thick layer composed of a green fluorescent pigment ALQ3 (8-hydroxyquinoline aluminum) and a 1000 Å-thick layer composed of a red fluorescent pigment PPD (phenanthryl phenylene diamine) were respectively formed on the ITO transparent electrode by vapor-deposition, thereby preparing one test specimen for each pigment layer.

Using the thus prepared laminates, the fluorescence intensity thereof was measured by the same method as defined in Reference Example 1. More specifically, the peak fluorescence intensity was measured in the direction of 30° (as an incident angle to substrate from transparent electrode) when measured from the vertical direction of a light emission side of the glass substrate. The peak fluorescence intensity of the test specimen vapor-deposited with ALQ3 was measured using a wavelength of 550 nm, whereas the peak fluorescence intensity of the test specimen vapor-deposited with PPD was measured using a wavelength of 450 nm.

The scattering loss of light was measured according to the above procedure. As a result, it was confirmed that the scattering loss of light based on the amount of light penetrated through the resultant laminate was 39% at a wavelength of 450 nm and 28% at a wavelength of 550 nm.

The light extraction efficiency of the respective fluorescent pigment-deposited laminates based on that in the below-mentioned Comparative Example 3 was as follows.

That is, it was confirmed that the light extraction efficiency was 240% for PPD at wavelength of 450 nm, and 190% for ALQ3 at a wavelength of 550 nm.

As a result, it was recognized that the light extraction efficiency was enhanced over a whole visible light range, and in particular, the light extraction efficiency of blue color light was remarkably enhanced as compared to that of green color light.

Comparative Example 3

The same procedure as defined in Reference Example 3 was conducted except that no titania particles were added to the coating solution, thereby producing a fluorescent device, and measuring the amount of light extracted therefrom by the same method.

As a result of measuring the surface roughness by the same method as defined in Reference Example 3, it was confirmed that the surface roughness Ra was 2 nm.

Reference Example 4

A polycarbonate resin "7020AD2" produced by Mitsubishi Engineering-Plastics Corporation, was dissolved in methylene chloride, and then titania particles (titanium dioxide) having a particle size of 200 nm were dispersed in the obtained solution such that the weight percentage of the titania particles in the resultant particle-containing layer was 10% by weight. The obtained dispersion was applied together with a solvent onto a glass substrate produced by the same method as defined in Reference Example 1 using a dip coater, and then dried at room temperature, thereby forming an evanescent light-scattering layer (particle-containing layer).

It was confirmed that the thickness of the evanescent light-scattering layer was 600 nm, and the refractive index of the matrix portion thereof as measured was 1.59. Further, as a result of measuring the surface roughness by the same method as defined in Reference Example 3, it was confirmed that the surface roughness Ra was 4 nm.

An ITO film and a pigment layer were successively formed on the resultant coated substrate by the same method as defined in Reference Example 3, and the resultant laminate was subjected to the measurement of fluorescence intensity. The measurement of the fluorescence intensity was conducted in the direction of 30° from the direction perpendicular to the light emission side of the glass substrate.

As a result, it was confirmed that the amount of light extracted from the above device was 170% (at a wavelength of 550 nm) as a relative value as measured in the same direction in the below-mentioned Comparative Example 4.

Comparative Example 4

The same procedure as defined in Reference Example 4 was conducted except that no alumina particles were added to the coating solution, thereby producing a fluorescent device, and measuring the amount of light extracted therefrom by the same method. As a result of measuring the surface roughness by the same method as defined in Reference Example 4, it was confirmed that the surface roughness Ra was 2 nm.

Reference Example 5

After forming a 200 Å-thick silica deposited film having a combined function as anchor coat and a barrier coat on a 120 μm-thick PET film produced by Mitsubishi Polyester Film Corporation, an evanescent light-scattering layer (particle-containing layer) was formed on the silica deposited film by the same method as defined in Reference Example 4. Meanwhile, before the evanescent light-scattering layer was completely dried up, the thus formed laminated film was closely contacted with an ITO-coated glass substrate. As a result, it was possible to adhere the film onto the ITO surface.

On the evanescent light-scattering layer of the film were successively formed an ITO layer and an ALO3 layer by the same method as defined in Reference Example 3, and further the resultant laminate was evaluated.

As a result, it was confirmed that the thickness of the evanescent light-scattering layer was 600 nm, and the refractive index of a matrix portion thereof was 1.59. Further, as a result of the measurement using a probe-type surface roughness tester "P-15" manufactured by KLA-Tencor Inc., it was confirmed that the surface roughness Ra was 4 nm.

The thus obtained substrate was subjected to measurement of fluorescence intensity thereof by the same method as defined in Reference Example 3. Further, the peak fluorescence intensity was measured in the direction of 30° (as an incident angle to substrate from transparent electrode) from the vertical direction of a light emission side of the glass substrate.

It was confirmed that the amount of light extracted from the above device was 160% on the basis of the amount of light extracted (at a wavelength of 550 nm) as similarly measured in the below-mentioned Comparative Example 5. From the results, it is expected that even when the laminate is used as an optical film for light extraction in a top emission type device, the light extraction efficiency is increased.

Comparative Example 5

The same procedure as defined in Reference Example 5 was conducted except that the thickness of the film was changed to 2700 nm, thereby producing a fluorescent device, and measuring the amount of light extracted therefrom by the same method. As a result of measuring the surface roughness of a surface before forming the transparent conductive film thereon using a probe-type surface roughness tester "P-15" manufactured by KLA-Tencor Inc., it was confirmed that the surface roughness Ra was 3 nm.

Reference Example 6

The same procedure as defined in Reference Example 4 was conducted except that the thickness of the evanescent light-scattering layer was changed to 1000 nm, thereby producing a device and measuring the amount of light extracted therefrom. As a result, it was confirmed that the amount of light extracted from the above device was 150% (at a wavelength of 550 nm) on the basis of the amount of light extracted in Comparative Example 4.

Comparative Example 6

The same procedure as defined in Reference Example 4 was conducted except that the thickness of the evanescent light-scattering layer was changed to 2700 nm, thereby producing a device and measuring the amount of light extracted therefrom. Although not limited to this Example, the required thickness was achieved by repeating the coating operation plural times, if required. As a result, it was confirmed that the amount of light extracted from the above device was 80% (at a wavelength of 550 nm) on the basis of the amount of light extracted in Comparative Example 4. It was considered that the device became opaque because of too large thickness of the evanescent light-scattering layer.

Reference Examples 7 and 8 and Comparative Examples 7 and 8

These Reference Examples and Comparative Examples were conducted for explaining the second invention.

Reference Example 7

Corresponding to Embodiment (3) Shown in FIG. 4

A glass plate having a thickness of 0.7 mm and a size of 75 mm square which was composed of a non-alkali glass "AN100" produced by Asahi Glass Co., Ltd., was immersed in 0.1N nitric acid for about one hour to subject the surface thereof to degreasing treatment, washed with pure water and then dried in an oven at 60° C., thereby obtaining a glass substrate 1.

Separately, a small amount of an acid catalyst (aluminum acetylacetonate) was added to a mixed solution containing 30% by weight of an oligomer of tetramethoxysilane ("MS51" produced by Mitsubishi Chemical Corporation), 50% by weight of BtOH, 8% by weight of desalted water and 12% by weight of MeOH, and then titania fine particles having an average particle size of 120 nm and containing particles having a particle size of from 70 to 150 nm in an amount of not less than 60% by weight, were added together with a surfactant to the resultant solution such that the weight ratio of the titania fine particles to MS51 was 10%. The resultant mixture was stirred at 60° C. for 3 hours, and allowed to stand for one week for aging.

The thus aged coating solution was applied onto the glass substrate 1 using a dip coater. The coated glass substrate was dried for 15 min, immersed in methanol for 5 min, taken out and dried for 5 min, and then heated in an oven at 150° C. for 15 min, thereby forming an evanescent light-scattering layer 4a thereon. Meanwhile, upon the dip-coating, a protective film was adhered onto a rear surface of the substrate, and peeled off after coating, thereby forming the coating film on only one surface thereof.

It was confirmed that the thickness of the evanescent light-scattering layer 4a was 600 nm and had a structure in which light-scattering particles were overlapped on each other in about five layers. As a result of measuring a refractive index of a low-refractive film composed of only a matrix material (material other than the fine particles) using an ellipsometer manufactured by "Sopra", it was confirmed that the refractive index was 1.27 at a wavelength of 550 nm.

Further, as a result of measuring the refractive index by "PRISM COUPLER MODEL 2010" manufactured by Metricon Inc., USA, in which a laser having a wavelength of 633 nm was used, it was confirmed that the refractive index was 1.29.

Zirconium oxide was vapor-deposited on the evanescent light-scattering layer 4a to form a 300 nm-thick barrier layer 10. Further, ITO was cold-sputtered to form a 1000 Å-thick transparent electrode layer 3 on the barrier layer, and then a 1000 Å-thick film composed of ALQ3 (fluorescent pigment: (8-hydroxyquinolinolate)aluminum) was vapor-deposited on the ITO transparent electrode layer. As a result of the measurement, it was confirmed that the refractive index of the ITO layer was 1.9.

Further, it was confirmed that the amount of light extracted from the above device was 170% on the basis of the amount of light extracted in the below-mentioned Comparative Example 7.

Comparative Example 7

The same procedure as defined in the below-mentioned Reference Example 8 was conducted except that no titania fine particles were added to the coating solution for forming an evanescent light-scattering layer, thereby producing a fluorescent light-emitting device having a layer structure corresponding to that shown in FIG. 14 and measuring an amount of light extracted from the device by the same method.

Comparative Example 8

The same procedure as defined in Comparative Example 7 was conducted except that the low-refractive layer 4 was omitted to form a layer structure shown in FIG. 13a, thereby producing a electroluminescent device and measuring an amount of light extracted from the device by the same method.

As a result, it was confirmed that the amount of light extracted was 91% on the basis of that of Comparative Example 7.

Reference Example 8

Corresponding to Embodiment (4) Shown in FIG. 5

The coating solution containing no titania fine particles as used in Comparative Example 7 was coated to form a low-refractive layer 4 having a thickness of 500 nm, and further the coating solution containing titania fine particles as used in Reference Example 7 was applied onto the low-refractive layer to form an evanescent light-scattering layer 4b having a thickness of 600 nm thereon.

Zirconium oxide was vapor-deposited on the evanescent light-scattering layer 4b to form a barrier layer 10 having a thickness of 300 nm. Then, ITO was cold-sputtered onto the barrier layer to form a transparent electrode layer 3 having a thickness of 1000 Å, and further a 1000 Å-thick ALQ3 layer was formed on the ITO layer by vapor deposition, by the same method as defined in Reference Example 7.

As a result of measuring an amount of light extracted from the thus obtained device by the same method as defined in Reference Example 7, it was confirmed that the amount of light extracted from the device of Reference Example 8 was 190% on the basis of that of Comparative Example 7.

Reference Examples 9 to 13 and Comparative Examples 9 to 11

These Reference Examples and Comparative Examples were conducted for explaining the third invention.

Reference Example 9

Corresponding to Embodiment (5) Shown in FIG. 7

A glass plate having a thickness of 0.7 mm and a size of 75 mm square which was composed of a non-alkali glass "AN100" produced by Asahi Glass Co., Ltd., was immersed in 0.1N nitric acid for about one hour to subject the surface thereof to degreasing treatment, washed with pure water and then dried in an oven at 60° C., thereby obtaining a glass substrate 1.

Separately, a small amount of an acid catalyst (aluminum acetylacetonate) was added to a mixed solution containing 30% by weight of an oligomer of tetramethoxysilane ("MS51" produced by Mitsubishi Chemical Corporation), 50% by weight of BtOH, 8% by weight of desalted water and 12% by weight of MeOH, and the resultant mixture was stirred at 60° C. for 3 hours, and allowed to stand for one week for aging.

The thus obtained coating solution was applied onto the glass substrate 1 using a dip coater. The coated glass substrate was dried for 15 min, immersed in methanol for 5 min, taken out and dried for 5 min, and then heated in an oven at 150° C. for 15 min, thereby forming a low-refractive layer 4 thereon. Meanwhile, upon the dip-coating, a protective film was adhered onto a rear surface of the substrate, and peeled off after coating, thereby forming the coating film on only one surface thereof.

It was confirmed that the thickness of the low-refractive layer 4 was 600 nm. As a result of measuring a refractive index of the low-refractive layer using an ellipsometer manufactured by "Sopra", it was confirmed that the refractive index was 1.27 at a wavelength of 550 nm. Further, as a result of measuring the refractive index using "PRISM COUPLER MODEL 2010" manufactured by Metricon Inc., USA, it was confirmed that the refractive index was 1.31 at a wavelength of 633 nm.

Next, an evanescent light-scattering layer B 3a was formed on the low-refractive layer 4 by the following procedure. That is, small amounts of a polythiophene-based conductive polymer and poly(3-alkylthiophene) were added to ITO fine particles having an average particle size of 50 nm, and then titania particles having an average particle size of 120 nm were dispersed in the mixture such that the content of the titania particles was 5% by weight on the basis of the total weight of the resultant mixture. The thus obtained mixture was dissolved and dispersed in chloroform, and the obtained coating solution was applied onto the low-refractive layer using a spin coater and then dried. As a result, it was confirmed that the obtained coating film had a thickness of 1000 nm, and the refractive index of a matrix portion of the obtained film was 1.8.

Further, a 1000 Å-thick film composed of ALQ3 (fluorescent pigment) was formed on the thus formed evanescent light-scattering layer B 3a by vapor-deposition.

As a result, it was confirmed that the amount of light extracted from the above device was 170% on the basis of that of the below-mentioned Comparative Example 9.

Comparative Example 9

The same procedure as defined in Reference Example 9 was conducted except that no titania fine particles were added to the coating solution for forming a transparent electrode layer, thereby producing a fluorescent device having a layer structure corresponding to that shown in FIG. 14 and measuring an amount of light extracted from the device by the same method.

Comparative Example 10

The same procedure as defined in Comparative Example 9 was conducted except that the low-refractive layer 4 was omitted to form a layer structure corresponding to that shown in FIG. 13a, thereby producing a fluorescent device and measuring an amount of light extracted from the device by the same method.

As a result, it was confirmed that the amount of light extracted was 91% on the basis of that of Comparative Example 9.

Reference Example 10

Corresponding to Embodiment (6) Shown in FIG. 8

The same procedure as defined in Reference Example 9 was conducted except that after forming an evanescent light-scattering layer B 3b having a thickness of 500 nm using the coating solution, the same coating solution as used above except for containing no titania fine particles was applied thereonto to form a transparent electrode layer 3 having a thickness of 500 nm, and further a 1000 Å-thick ALQ3 layer was formed thereon by vapor deposition.

As a result, it was confirmed that the amount of light extracted from the above device was 160% on the basis of that of Comparative Example 9.

Reference Example 11

The same procedure as defined in Reference Example 9 was conducted except that no low-refractive layer was formed, thereby producing a fluorescent light-emitting device and measuring an amount of light extracted from the device by the same method. As a result, it was confirmed that the amount of light extracted from the above device was 150% on the basis of that of Comparative Example 9.

Reference Example 12

A glass substrate was prepared by the same method as defined in Reference Example 9. A coating solution for forming a high-refractive light-scattering film was prepared by the following procedure. That is, tetraisopropyloxytitanium (Ti(O-i-$C_3H_7$)$_4$) and anhydrous ethanol ($C_2H_5OH$) were mixed with each other under stirring at room temperature at a mixing molar ratio of 1:4. In this case, silica particles having an average particle size of 200 nm were previously dispersed in anhydrous ethanol such that the weight percentage of the silica particles in the resultant particle-containing layer was 10% by weight. Meanwhile, the weight percentage of the particles in the particle-containing layer was measured by the same method as used for the above measurement of the particle size distribution therein. The conversion of volume into weight was conducted by measuring a density of the particles and a matrix of the layer. In the case where the matrix was porous, the density was calculated from X-ray reflectance or refractive index measured.

A mixed solution containing ethanol, water and hydrochloric acid at a molar ratio of 4:1:0.08 was added to the above prepared solution at 0° C. using a burette to accelerate a hydrolysis reaction of the solution, thereby obtaining a titania sol. The resultant silica sol was applied on the substrate, and the obtained coating layer was heated at 300° C. for 10 min, thereby forming an evanescent light-scattering layer. As a result, it was confirmed that the thickness of the obtained evanescent light-scattering layer was 500 nm, and the refractive index of a matrix portion of the layer was 2.1.

Onto the evanescent light-scattering layer, ITO was cold-sputtered to form a 500 Å-thick transparent conductive film. As a result of the measurement, it was confirmed that the refractive index of the transparent conductive film was 1.9. Further, a light-emitting layer was formed on the ITO layer by the same method as defined in Reference Example 9, thereby producing a fluorescent device. As a result, it was confirmed that the amount of light extracted from the above device was 170% on the basis of that of the below-mentioned Comparative Example 11.

Comparative Example 11

The same procedure as defined in Reference Example 12 was conducted except that no silica particles were added to the coating solution, thereby producing a fluorescent light-emitting device and measuring an amount of light extracted from the device by the same method.

Reference Example 13

The same procedure as defined in Reference Example 11 was conducted except that the ITO transparent conductive film was formed by the same procedure as defined in Reference Example 12, before forming the light-emitting layer, thereby producing a fluorescent light-emitting device and measuring an amount of light extracted from the device by the same method. As a result, it was confirmed that the amount of light extracted from the above device was 140% on the basis of that of Comparative Example 9.

Reference Examples 14 to 17 and Comparative Examples 12 to 15

These Reference Examples and Comparative Examples were conducted for explaining the fourth invention.

Reference Example 14

Corresponding to Embodiment (7) Shown in FIG. 10

A glass plate having a thickness of 0.7 mm and a size of 75 mm square which was composed of a non-alkali glass "AN100" produced by Asahi Glass Co., Ltd., was immersed in 0.1N nitric acid for about one hour to subject the surface thereof to degreasing treatment, washed with pure water and then dried in an oven at 60° C., thereby obtaining a glass substrate 1.

Separately, a small amount of an acid catalyst (aluminum acetylacetonate) was added to a mixed solution containing 30% by weight of an oligomer of tetramethoxysilane ("MS51" produced by Mitsubishi Chemical Corporation), 50% by weight of BtOH, 8% by weight of desalted water and 12% by weight of MeOH, and the resultant mixture was stirred at 60° C. for 3 hours, and allowed to stand for one week for aging.

The thus obtained coating solution was applied onto the glass substrate 1 using a dip coater. The coated glass substrate was dried for 15 min, immersed in methanol for 5 min, taken out and dried for 5 min, and then heated in an oven at 150° C. for 15 min, thereby forming a low-refractive layer 4 thereon. Meanwhile, upon the dip-coating, a protective film was adhered onto a rear surface of the substrate, and peeled off after coating, thereby forming the coating film on only one surface thereof.

It was confirmed that the thickness of the low-refractive layer 4 was 600 nm. As a result of measuring a refractive index of the low-refractive layer using an ellipsometer manufactured by "Sopra", it was confirmed that the refractive index was 1.27 at a wavelength of 550 nm. Further, as a result of measuring the refractive index using "PRISM COUPLER MODEL 2010" manufactured by Metricon Inc., USA in which a laser having a wavelength of 633 nm was used, it was confirmed that the refractive index was 1.30.

The thus formed low-refractive layer 4 was subjected to the following treatment for forming roughness thereon. That is, the whole surface the low-refractive layer was lightly rubbed with a sandpaper having 1000-mesh fine roughness to roughen the surface. Then, the roughened surface was fully air-blown to remove rub-off matters therefrom. As a result, it was confirmed that the thus treated low-refractive layer 4 exhibited a surface roughness Ra of 100 nm and Rmax of 500 nm.

Next, a transparent electrode layer 3 was formed on the low-refractive layer 4 by the following procedure. That is, a polythiophene-based conductive polymer together with the same amount of poly(3-alkylthiophene) were added to ITO fine particles having an average particle size of 50 nm. The obtained mixture was dissolved and dispersed in chloroform, and the resultant coating solution was applied onto the low-refractive layer using a spin coater and then dried. As a result, it was confirmed that the obtained coating film had a thickness of 800 nm, and the refractive index of a matrix portion of the obtained film was 1.8.

Further, a 1000 Å-thick film composed of ALQ3 (fluorescent pigment) was formed on the transparent electrode layer 3 by vapor deposition.

As a result, it was confirmed that the amount of light extracted from the above device was 190% on the basis of that of the below-mentioned Comparative Example 12.

Comparative Example 12

The same procedure as defined in Reference Example 14 was conducted except that the low-refractive layer 4 was subjected to no treatment for forming roughness thereon, thereby producing a fluorescent device having a layer structure corresponding to that shown in FIG. 14 and measuring an amount of light extracted from the device by the same method. As a result, it was confirmed that the thus treated low-refractive layer 4 exhibited a surface roughness Ra of 2 nm and Rmax of 20 nm.

Comparative Example 13

The same procedure as defined in Comparative Example 12 was conducted except that the low-refractive layer 4 was omitted to form a layer structure corresponding to that shown in FIG. 13a, thereby producing a fluorescent light-emitting device and measuring an amount of light extracted from the device by the same method. As a result, it was confirmed that the glass substrate exhibited a surface roughness Ra of 1 nm and Rmax of 5 nm.

Also, it was confirmed that the amount of light extracted from the above device was 91% on the basis of that of Comparative Example 12.

Reference Example 15

Corresponding to Embodiment (8) Shown in FIG. 11

The same procedure as defined in Reference Example 14 was conducted except that after a high-refractive layer 8 having a thickness of 1000 nm (1 µm) was formed using the coating solution, ITO was cold-sputtered to form a 100 nm-thick transparent electrode layer 3A on the high-refractive layer, and further a 1000 Å-thick ALQ3 layer was formed on the ITO layer by vapor deposition. As a result of the measurement, it was confirmed that the refractive index of the ITO layer was 1.85.

Also, it was confirmed that the amount of light extracted from the above device was 170% on the basis of that of Comparative Example 12.

Reference Example 16

A glass substrate was prepared by the same method as defined in Reference Example 14. One surface of the glass substrate was subjected to blast treatment using an apparatus "NEWMA BLASTER SGK Model" manufactured by Fuji Seisakusho Co., Ltd. After the blast treatment, the glass substrate was immersed in 0.1N nitric acid for about one hour to subject the treated surface thereof to degreasing treatment. Then, the thus treated substrate was subjected to ultrasonic washing with pure water, and then dried in an oven at 60° C. As a result of the measurement, it was confirmed that the treated surface exhibited a surface roughness Ra of 100 nm and Rmax of 600 nm.

Next, a coating solution prepared under the following conditions was applied on the substrate by dip-coating method to form a coating film thereon. Meanwhile, upon the dip-coating, a protective film was adhered onto a rear surface of the substrate, and peeled off after coating, thereby forming the coating film on only one surface thereof.

Tetraisopropyloxytitanium ($Ti(O-i-C_3H_7)_4$) and anhydrous ethanol ($C_2H_5OH$) were mixed with each other under stirring at room temperature at a mixing molar ratio of 1:4. Then, a mixed solution containing ethanol, water and hydrochloric acid at a molar ratio of 4:1:0.08 was added to the resultant mixture at 0° C. using a burette to accelerate a hydrolysis reaction thereof, thereby obtaining a titania sol. The resultant titania sol was applied onto the substrate, and the obtained coating layer was heated at 300° C. for 10 min, thereby forming a coating film having a thickness of 600 nm. As a result of the measurement, it was confirmed that the refractive index of a matrix portion of the coating film was 2.1.

Onto the coating film, ITO was cold-sputtered by the same method as defined in Reference Example 15 to form a transparent conductive film. Further, a light-emitting layer was similarly formed on the ITO layer, thereby producing a fluorescent device and measuring an amount of light extracted from the device. As a result, it was confirmed that the amount of light extracted from the above device was 220% on the basis of that of the below-mentioned Comparative Example 14.

Comparative Example 14

The same procedure as defined in Reference Example 16 was conducted except that no blast treatment was conducted, thereby producing a fluorescent light-emitting device and evaluating the device by the same method.

Reference Example 17

A glass substrate was subjected to blast treatment by the same method as defined in Reference Example 16. Next, a coating solution prepared by dissolving a polycarbonate resin "7020AD2" produced by Mitsubishi Engineering-Plastics Corporation, was applied onto the treated surface of the substrate using a spin coater, and then dried to form a coating film thereon. As a result, it was confirmed that the coating film had a thickness of 800 nm, and the refractive index of a matrix portion of the coating film was 1.59.

Onto the coating film, ITO was cold-sputtered by the same method as defined in Reference Example 15 to form a transparent conductive film. Further, a light-emitting layer was similarly formed on the ITO layer, thereby producing a fluorescent device and measuring an amount of light extracted from the device. As a result, it was confirmed that the amount of light extracted from the above device was 160% on the basis of that of the below-mentioned Comparative Example 15.

Comparative Example 15

The same procedure as defined in Reference Example 17 was conducted except that the glass substrate was subjected to no blast treatment, thereby producing a fluorescent light-emitting device and evaluating the device by the same method.

INDUSTRIAL APPLICABILITY

As described above, in accordance with the present invention, the light extraction efficiency of the electroluminescent device can be remarkably enhanced. According to the present invention, irrespective of inorganic or organic materials, applications of displays and applications of surface light-emitting sources, the light extraction efficiency of the electroluminescent device can be extensively enhanced.

In particular, when a barrier layer is provided in the device, a transparent electrode layer or an electroluminescent layer can be suitably protected, so that deterioration of electroluminescent pigments and formation of dark spots can be prevented, and the life of the device can be prolonged.

The invention claimed is:

1. An electroluminescent device successively comprising a cathode, an electroluminescent layer, a transparent electrode layer, a low refractive layer and a transparent sheet/plate, wherein an evanescent light-scattering layer (B) containing light-scattering particles is provided between the transparent electrode layer and the low-refracting layer, a matrix constituting the evanescent light-scattering layer (B) has a refractive index which is substantially identical to that of the transparent electrode layer, and the refractive index of the low-refractive layer is lower than the refractive index of the transparent sheet/plate and is lower than the refractive index of matrix constituting the evanescent light-scattering layer (B).

2. An electroluminescent device according to claim 1, wherein the evanescent light-scattering layer (B) contains the light-scattering particles in an amount of 1 to 40% by volume, and not less than 60% by weight of the light-scattering particles have a particle size of 30 to 400 nm.

3. An electroluminescent device according to claim 1, wherein a thickness of the evanescent light-scattering layer (B) is not less than 2 times an average particle size of the light-scattering particles.

4. An electroluminescent device according to claim 1, wherein the light-scattering particles are composed of silica, colloidal silica, titania, zirconia, ITO (indium tin oxide), ATO (antimony tin oxide) or alumina.

5. An electroluminescent device according to claim 1, wherein the transparent sheet/plate is a transparent substrate.

6. An electroluminescent device according to claim 1, wherein the cathode is formed on a transparent substrate, and the transparent sheet/plate is a protective cover.

* * * * *